United States Patent
Kim et al.

(10) Patent No.: US 11,552,099 B2
(45) Date of Patent: Jan. 10, 2023

(54) VERTICAL-TYPE NONVOLATILE MEMORY DEVICE INCLUDING AN EXTENSION AREA CONTACT STRUCTURE

(71) Applicant: SAMSUNG ELECTRONICS CO., LTD., Suwon-si (KR)

(72) Inventors: Kyungdong Kim, Hwaseong-si (KR); Younghwan Son, Hwaseong-si (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 164 days.

(21) Appl. No.: 16/928,306

(22) Filed: Jul. 14, 2020

(65) Prior Publication Data

US 2021/0151460 A1     May 20, 2021

(30) Foreign Application Priority Data

Nov. 14, 2019    (KR) ........................ 10-2019-0146171

(51) Int. Cl.
*H01L 27/11582*     (2017.01)
*H01L 27/11519*     (2017.01)
(Continued)

(52) U.S. Cl.
CPC .. *H01L 27/11582* (2013.01); *H01L 27/11519* (2013.01); *H01L 27/11526* (2013.01);
(Continued)

(58) Field of Classification Search
CPC ......... H01L 27/11582; H01L 27/11519; H01L 27/11526; H01L 27/11556;
(Continued)

(56) References Cited

U.S. PATENT DOCUMENTS 8,951,859 B2    2/2015    Higashitani et al.
9,524,903 B2    12/2016   Lee
(Continued)

OTHER PUBLICATIONS

German Office Action issued in corresponding DE Patent Application No. 102020121762.5 dated May 30, 2022.

*Primary Examiner* — Sophia T Nguyen
*Assistant Examiner* — Tenley H Schofield
(74) *Attorney, Agent, or Firm* — F. Chau & Associates, LLC

(57) ABSTRACT

A vertical-type nonvolatile memory device including: a substrate including a cell array area and an extension area, the extension area extending in a first direction from the cell array area and including contacts; a channel structure extending in a vertical direction from the substrate; a first stack structure including gate electrode layers and interlayer insulating layers alternately stacked along sidewalls of the channel structure; a plurality of division areas extending in the first direction and dividing the cell array area and the extension area in a second direction perpendicular to the first direction; in the extension area, two insulating layer dams are arranged between two division areas adjacent to each other; a second stack structure including sacrificial layers and interlayer insulating layers alternately stacked on the substrate between the two insulating layer dams; and an electrode pad connected to a first gate electrode layer in the extension area.

17 Claims, 24 Drawing Sheets

(51) Int. Cl.
   *H01L 27/11526* (2017.01)
   *H01L 27/11565* (2017.01)
   *H01L 27/11573* (2017.01)
   *H01L 27/11556* (2017.01)

(52) U.S. Cl.
   CPC .. *H01L 27/11556* (2013.01); *H01L 27/11565* (2013.01); *H01L 27/11573* (2013.01)

(58) Field of Classification Search
   CPC ......... H01L 27/11565; H01L 27/11573; H01L 27/11548
   See application file for complete search history.

(56) References Cited

U.S. PATENT DOCUMENTS

| | | |
|---|---|---|
| 9,691,782 B1 | 6/2017 | Hwang et al. |
| 9,754,963 B1* | 9/2017 | Kawamura ....... H01L 27/11565 |
| 9,837,433 B2 | 12/2017 | Oh et al. |
| 9,991,271 B2 | 6/2018 | Kang et al. |
| 10,256,248 B2 | 4/2019 | Lu et al. |
| 2015/0325587 A1* | 11/2015 | Chen ................. H01L 21/76877 |
| | | 257/314 |
| 2016/0079069 A1 | 3/2016 | Uenaka et al. |
| 2017/0117222 A1 | 4/2017 | Kim et al. |
| 2017/0179028 A1* | 6/2017 | Lee ................... H01L 27/11565 |
| 2017/0200676 A1* | 7/2017 | Jeong ................ H01L 27/11556 |
| 2017/0271354 A1* | 9/2017 | Kwak ............... H01L 27/11548 |
| 2018/0240805 A1 | 8/2018 | Yun et al. |
| 2018/0261618 A1* | 9/2018 | Lee ................... H01L 27/11575 |
| 2019/0296038 A1 | 9/2019 | Noda et al. |
| 2021/0143100 A1* | 5/2021 | Chakravarthi ...... H01L 23/5283 |

\* cited by examiner

VERTICAL-TYPE NONVOLATILE MEMORY DEVICE INCLUDING AN EXTENSION AREA CONTACT STRUCTURE

CROSS-REFERENCE TO RELATED APPLICATION

This application claims priority under 35 U.S.C. § 119 to Korean Patent Application No. 10-2019-0146171, filed on Nov. 14, 2019 in the Korean intellectual Property Office, the disclosure of which is incorporated by reference herein in its entirety.

TECHNICAL FIELD

The inventive concept relates to a nonvolatile memory device and a method of fabricating the same, and more particularly, to a nonvolatile memory device having a vertical channel structure with increased integration density and a method of fabricating the same.

DISCUSSION OF RELATED ART

Nonvolatile memory is a type of computer memory that can retrieve stored information even after having been power cycled. Devices including nonvolatile memory are increasingly used. For example, MP3 players, digital cameras, mobile phones, camcorders, flash cards, and solid state disks (SSDs) use the nonvolatile memories for storage. Among the nonvolatile memories, a flash memory can electrically and collectively erase data of a cell, and thus, is widely used as a storage device instead of a hard disk. However, as a storage capacity of the flash memory increases, a method of efficiently using a storage space of the flash memory is desired. Accordingly, a nonvolatile memory device including a vertical transistor structure instead of a planar transistor structure may be employed.

SUMMARY

According to an exemplary embodiment of the inventive concept, there is provided a vertical-type nonvolatile memory device including: a substrate including a cell array area and an extension area, the extension area extending in a first direction from the cell array area and including vertical contacts; a vertical channel structure extending in a vertical direction from a top surface of the substrate; a first stack structure including gate electrode layers and interlayer insulating layers that are alternately stacked along sidewalls of the vertical channel structure; a plurality of division areas extending in the first direction and dividing the cell array area and the extension area into units in a second direction perpendicular to the first direction; in the extension area, two insulating layer dams are arranged between two of the division areas adjacent to each other in the second direction, wherein the two insulating layer dams extend in the first direction; a second stack structure including sacrificial layers and interlayer insulating layers that are alternately stacked on the substrate between the two insulating layer dams; and an electrode pad connected to a first gate electrode layer of the gate electrode layers in the extension area.

In addition, according to another exemplary embodiment of the inventive concept, there is provided a vertical-type nonvolatile memory device including: a substrate including a cell array area and an extension area extending in a first direction from the cell array area; a vertical channel structure extending in a vertical direction from a top surface of the substrate; a first stack structure including gate electrode layers and interlayer insulating layers that are alternately stacked along sidewalls of the vertical channel structure; a division area extending in the first direction and dividing the cell array area and the extension area into units in a second direction perpendicular to the first direction; in the extension area, two insulating layer dams are arranged between two division areas adjacent to each other in the second direction, wherein the two insulating layer dams extend in the first direction; a second stack structure including sacrificial layers and interlayer insulating layers that are alternately stacked on the substrate between the two insulating layer dams; an electrode pad connected to a first gate electrode layer of the gate electrode layers and arranged in the extension area, the electrode pad comprising a first pad area on the first stack structure and a second pad area on the second stack structure; and a vertical contact arranged in the extension area and inserted into the second stack structure via the second pad area of the electrode pad.

Further, according to another exemplary embodiment of the inventive concept, there is provided a method of manufacturing a vertical-type nonvolatile memory device including: forming a mold structure by alternately stacking interlayer insulating layers and sacrificial layers on a substrate including a cell array area and an extension area; forming, in the extension area, insulating layer dams extending in a first direction on the substrate and being apart from each other in a second direction perpendicular to the first direction; forming a stepped structure exposing the sacrificial layers in the first direction in the extension area by etching the mold structure; forming an additional sacrificial layer on the exposed sacrificial layers in the extension area; forming, on the substrate, a vertical channel structure to penetrate the mold structure and extending in a direction perpendicular to a top surface of the substrate; forming, on the substrate, a first division trench extending in the first direction and dividing the cell array area and the extension area; forming a first stack structure comprising gate electrode layers and interlayer insulating layers that are alternately stacked along sidewalls of the vertical channel structure, by replacing the sacrificial layer and the additional sacrificial layer with a first conductive layer by using the first division trench; forming a division area by forming an insulating layer in the first division trench; and forming, in the extension area, a vertical contact connected to an electrode pad, wherein two insulating layer dams are arranged in the second direction from the division area, and in the forming of the first stack structure, the first stack structure is formed in the cell array area, a second stack structure that is substantially identical to the mold structure between the two insulating layer dams is maintained, and the electrode pad, which is connected to the gate electrode layers in the extension area, is formed.

According to yet another exemplary embodiment of the inventive concept, there is provided a vertical-type nonvolatile memory device including: a substrate including a cell array area and an extension area, the extension area extending in a first direction from the cell array area and including vertical contacts; a vertical channel structure extending in a vertical direction from a top surface of the substrate; a first stack structure including gate electrode layers and interlayer insulating layers that are alternately stacked along sidewalls of the vertical channel structure; a plurality of division areas extending in the first direction and dividing the cell array area and the extension area into units in a second direction perpendicular to the first direction; in the extension area, two insulating layer dams are arranged between two of the division areas adjacent to each other in the second direction, wherein the two insulating layer dams extend in the first direction; a second stack structure including sacrificial layers and interlayer insulating layers that are alternately stacked on the substrate between the two insulating layer dams; a first electrode pad connected to a first gate electrode layer of the gate electrode layers in the extension area; and a second electrode pad connected to a first sacrificial layer of the sacrificial layers in the extension area.

BRIEF DESCRIPTION OF THE DRAWINGS

The above and other features of the inventive concept will be more clearly understood by describing in detail exemplary embodiments thereof in conjunction with the accompanying drawings in which.

DETAILED DESCRIPTION OF THE EMBODIMENTS

Figure 1:
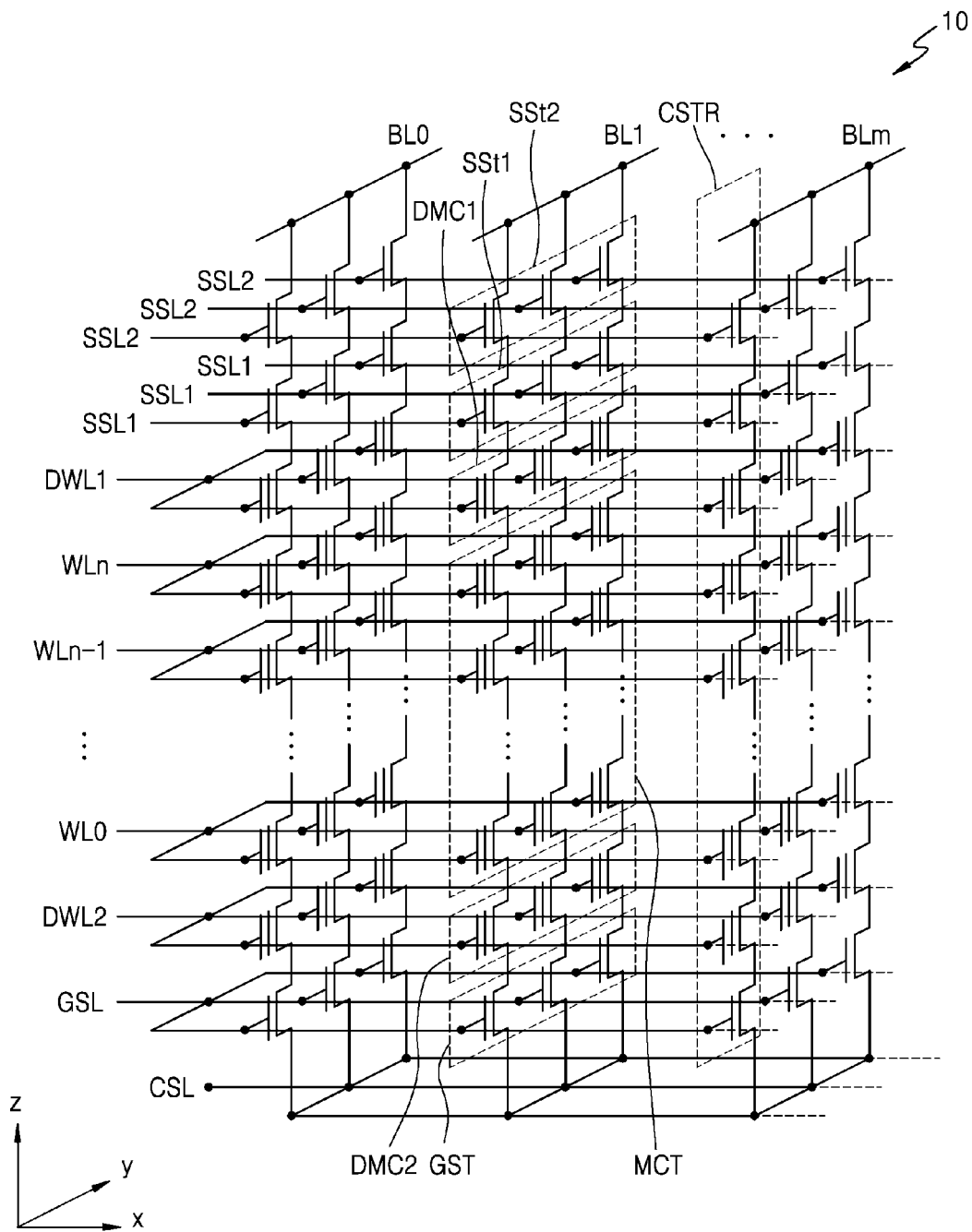
FIG. 1 is an equivalent circuit of a memory cell array of a vertical-type nonvolatile memory device, according to an exemplary embodiment of the inventive concept.

Hereinafter, exemplary embodiments of the inventive concept will be described in detail with reference to the accompanying drawings. Identical reference numerals may be used for the same constituent elements in the drawings, and thus, duplicate descriptions thereof may be omitted.

FIG. 1 is an equivalent circuit of a memory cell array of a vertical-type nonvolatile memory device 10, according to an exemplary embodiment of the inventive concept.

Referring to FIG. 1, the vertical nonvolatile memory device 10 according to an exemplary embodiment of the inventive concept may include a common source line CSL, a plurality of bit lines (BL0 through BLm), and a plurality of cell strings CSTR. The bit lines (BL0 through BLm) may be two-dimensionally arranged, and the plurality of cell strings CSTR may be connected to each of the bit lines (BL0 through BLm) in parallel. The plurality of cell strings CSTR may be connected to the common source line CSL in common.

Each of the cell strings CSTR may include a first string select transistor SSt1, a second string select transistor SSt2, memory cell transistors MCT, and a ground select transistor GST. Each of the memory cell transistors MCT may include a data storage element. The first and second string select transistors SSt1 and SSt2 may be connected to each other in series, the second string select transistor SSt2 may be connected to a corresponding one of the bit lines (BL0 through BLm), and the ground select transistor GST may be connected to the common source line CSL. In addition, the memory cell transistors MCT may be connected in series between the first string select transistor SSt1 and the ground select transistor GST. In some exemplary embodiments of the inventive concept, one string select transistor (SSt1 or SSt2) may be arranged in each of the cell strings CSTR. The first and second string select transistors SSt1 and SSt2 may be connected to string select lines SSL1 and SSL2.

As illustrated in FIG. 1, each of the cell strings CSTR may include a first dummy cell transistor DMC1 connected between the first string select transistor SSt1 and one of the memory cell transistors MCT, and a second dummy cell transistor DMC2 connected between the ground select transistor GST and one of the memory cell transistors MCT. However, in some exemplary embodiments of the inventive concept, at least one of the first and second dummy cell transistors DMC1 and DMC2 may be omitted. The first and second dummy cell transistors DMC1 and DMC2 may be connected to dummy select lines DWL1 and DWL2. A ground select line GSL may be disposed between a common source line CSL and the dummy select line DWL2.

Since one cell string CSTR includes a plurality of memory cell transistors MCT having different distances from the common source lines CSL, multi-layered word lines (WL0 through WLn) may be located between the common source lines CSL and the bit lines (BL0 through BLm). In addition, gate electrodes of the memory cell transistors MCT that are arranged at substantially the same distance from the common source lines CSL may be connected to one of the word lines (WL0 through WLn) in common, and accordingly, may be in an equipotential state.

In the vertical-type nonvolatile memory device 10 of the present embodiment, as an insulating layer dam (refer to ID in FIG. 2) is formed in an extension area (refer to EA in FIG. 2) in which electrode pads (refer to ELp1 and ELp2 in FIG. 2) are formed, a bridge defect in which a vertical contact (refer to VC in FIG. 2) is connected to a gate electrode layer (see EL1 and EL2 in FIG. 3b) under the electrode pads (ELp1 and ELp2 in FIG. 2) in the extension area EA may not occur, and accordingly, a vertical nonvolatile memory device having improved reliability may be implemented.

Figure 2:
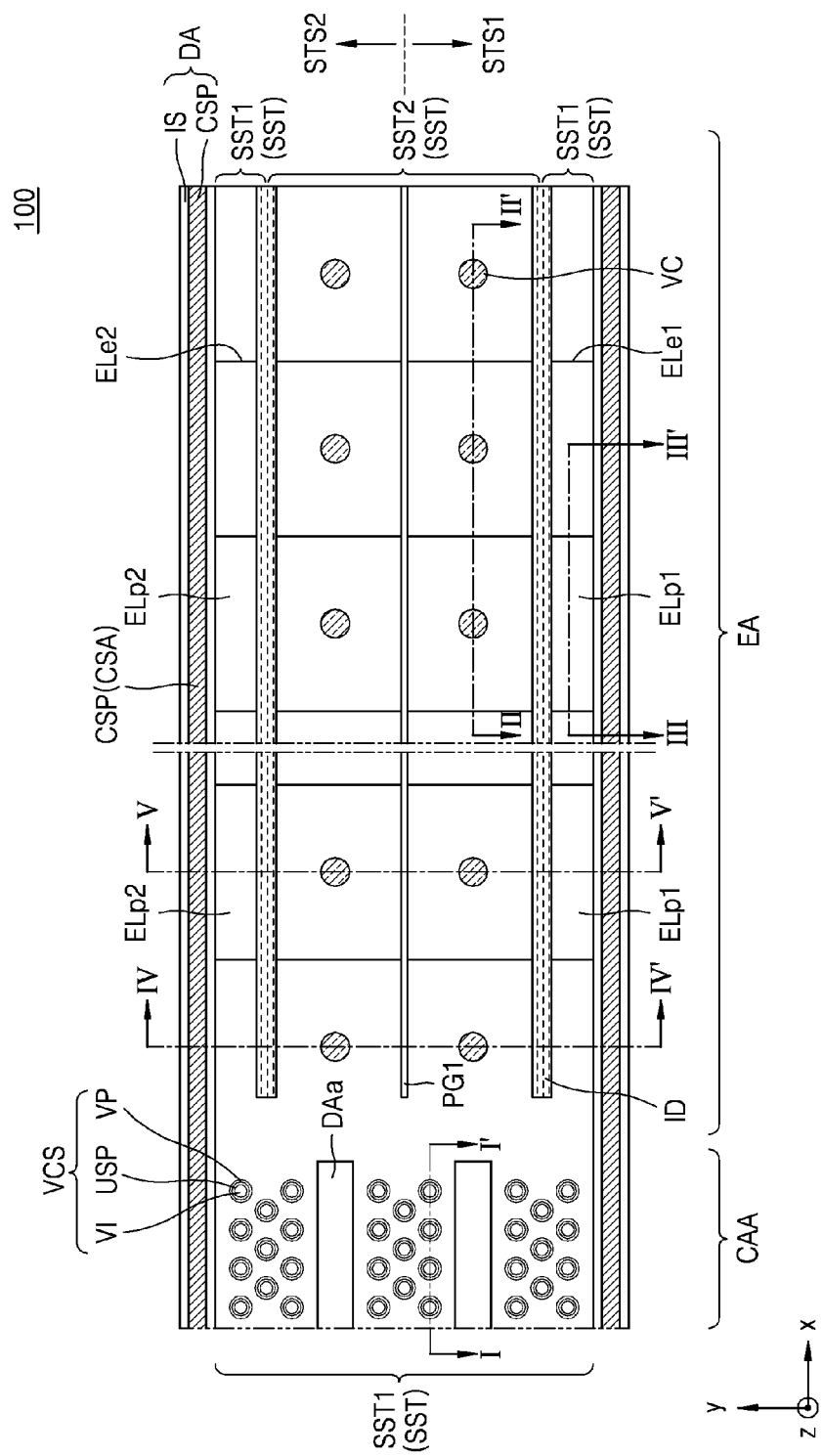
FIG. 2 is a plan view illustrating a vertical-type nonvolatile memory device, according to an exemplary embodiment of the inventive concept.
Figure 3A:
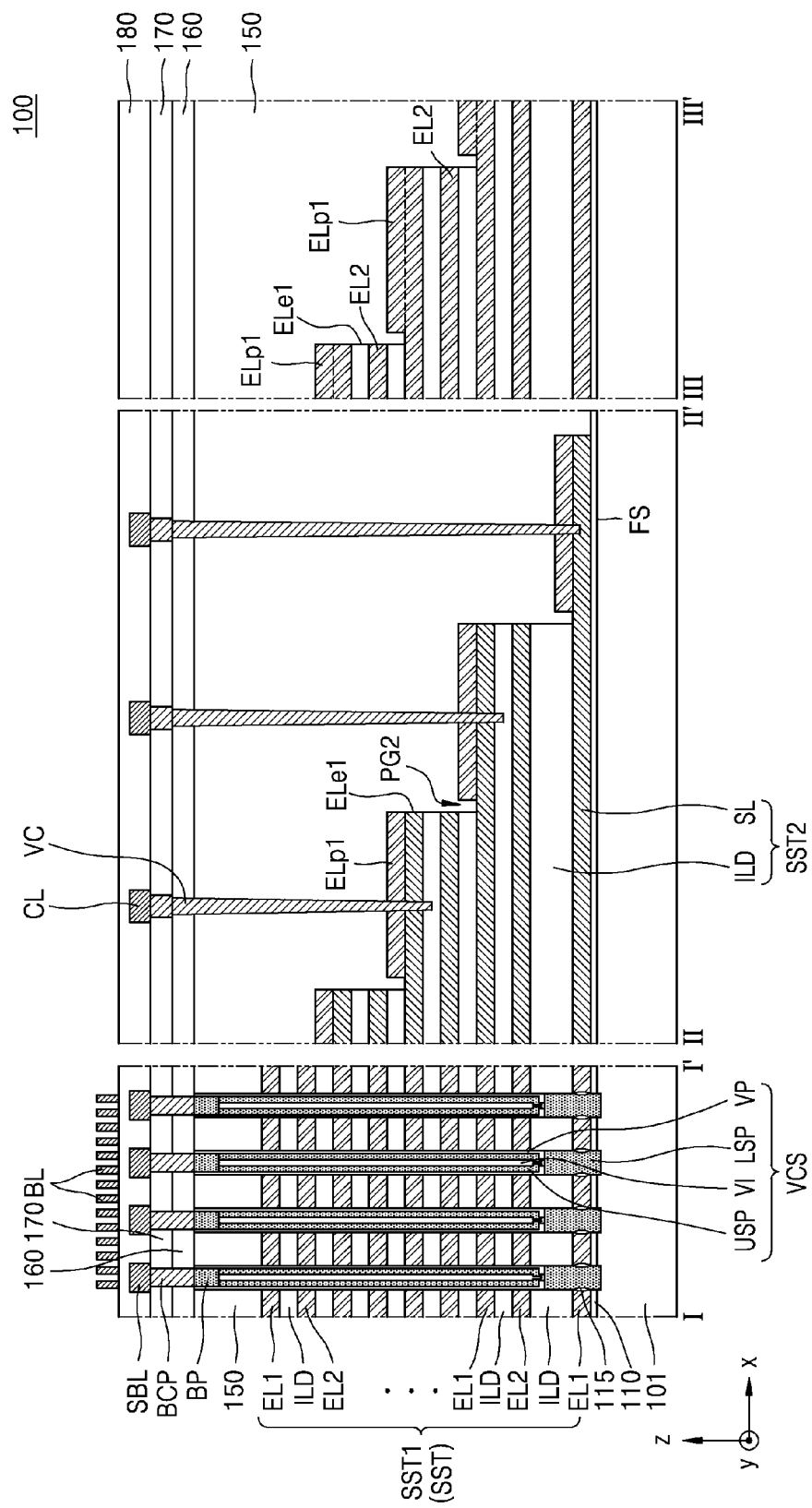
FIG. 3A is a cross-sectional view illustrating the vertical-type nonvolatile memory device of FIG. 2 taken along line II'-II', II-II', and III-III'.
Figure 3B:
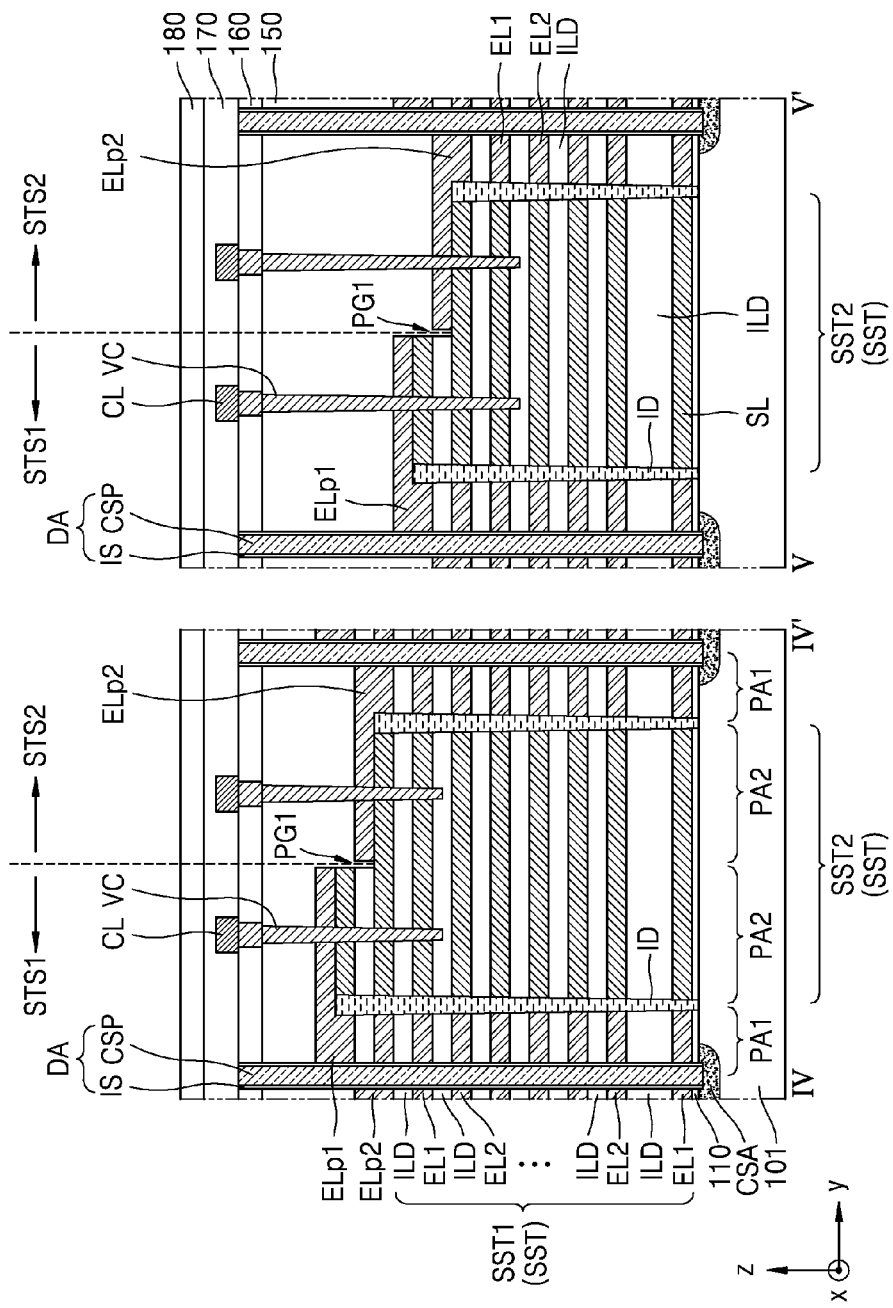
FIG. 3B is a cross-sectional view illustrating the vertical-type nonvolatile memory device of FIG. 2 taken along line IV' and V-V'.

FIG. 2 is a plan view of a vertical nonvolatile memory device 100 according to an exemplary embodiment of the inventive concept. FIG. 3A illustrates cross-sectional views of the vertical nonvolatile memory device 100 of FIG. 2 taken along lines I-I', II-II', and III-III', and FIG. 3B illustrates cross-sectional views of the vertical nonvolatile memory device 100 of FIG. 2 taken along lines IV-IV' and V-V'. Descriptions already given with reference to FIG. 1 are briefly given or omitted.

Referring to FIGS. 2 through 3B, the vertical nonvolatile memory device 100 according to the present embodiment may include a cell array area CAA and the extension area EA on a substrate 101. For reference, FIG. 2 is a plan view corresponding to top surfaces of uppermost gate electrode layers (EL1 and EL2) in the cell array area CAA in FIG. 3A, and a planarized insulating layer 150 is omitted in the extension area EA.

The substrate 101 may have a top surface FS extending in a first direction (x direction) and a second direction (y direction). The substrate 101 may include a semiconductor material, for example, a Group IV semiconductor, a Group III-V compound semiconductor, or a Group II-VI oxide semiconductor. A cell area and a peripheral circuit area arranged outside the cell area may be on the substrate 101.

The cell array area CAA and the extended area EA may be in the cell area of the substrate 101. The cell array area CAA may be an area in which the first and second string select transistors SSt1 and SSt2, the memory cell transistors MCT, and the ground select transistor GST described in FIG. 1 are arranged. The plurality of bit lines (BL0 through BLm) may be on a top surface of the cell array area CAA, and impurity areas and the common source line CSL may be under the cell array area CAA.

The extension area EA may be an area in which the electrode pads (ELp1 and ELp2) that are formed by extending the gate electrode layers (EL1 and EL2) of the first and second string select transistors SSt1 and SSt2, the memory cell transistors MCT, and the ground select transistor GST in the first direction (x direction) from the cell array area CAA are arranged. The electrode pads (ELp1 and ELp2) may be differentiated by a first electrode pad ELp1 and a second electrode pad ELp2, respectively, and the vertical contact VC may be connected to each of the first electrode pad ELp1 and the second electrode pad ELp2. In addition, the electrode pads (ELp1 and ELp2) may have a raised pad structure. In the extension area EA, the gate electrode layers (EL1 and EL2) and the first and second electrode pads ELp1 and ELp2 may have a stepped structure in the first direction (x direction). Detailed descriptions on the stepped structure of the gate electrode layers (EL1 and EL2) and the first and second electrode pads ELp1 and ELp2 are provided in more detail when describing a structure of the insulating layer dam ID in the extension area EA.

A stack structure SST may be on the substrate 101. The stack structure SST may extend from the cell array area CAA to the extension area EA in the first direction (x direction) OP the substrate 101. A buffer insulating layer 110 may be between the stack structure SST and the substrate 101. The stack structure SST may be provided in plural on the substrate 101 and may be arranged apart from each other in the second direction (y direction). For example, a division area DA extending in the first direction (x direction) may be disposed along the second direction (y direction), and the stack structures SST may be apart from each other with the division area DA therebetween. In this case, the division area DA may be referred to as a word line cut area, and an insulating spacer IS and a common source plug CSP may be arranged therein.

As illustrated in FIG. 2, at least one additional division area DAa extending in the first direction (x direction) may be included in the cell array area CAA between two division areas DA adjacent to each other in the second direction (y direction). The additional division area DAa may be provided so that a replacement process of the gate electrode layers (EL1 and EL2) may be more easily performed. In some exemplary embodiments of the inventive concept, the additional division area DAa may be omitted.

The stack structure SST may include the first stack structure SST1 and the second stack structure SST2. The first stack structure SST1 may be formed in the cell array area CAA and between the insulating layer dam ID and the division area DA of the extension area EA. The second stack structure SST2 may be formed between two insulating layer dams ID adjacent to each other of the extension area EA.

The first stack structure SST1 may include the gate electrode layers (EL1 and EL2) and an interlayer insulating layer ILD that are alternately and repeatedly stacked in a third direction (z direction) perpendicular to the top surface FS of the substrate 101. Thicknesses of the gate electrode layers (EL1 and EL2) may be substantially the same. A thickness of the interlayer insulating layer ILD may vary depending on characteristics of a memory device. In addition, the thickness of the interlayer insulating layer ILD may be less than the thicknesses of the gate electrode layers (EL1 and EL2). Each of the gate electrode layers (EL1 and EL2) may be connected to a portion of the first and second electrode pads ELp1 and ELp2 in the extension area EA. For example, the first and second electrode pads ELp1 and ELp2 may be divided into a first pad area PA and a second pad area PA2 in the second direction (y direction) on sides of the insulating layer dam ID in the extension area EA, respectively, and the gate electrode layers (EL1 and EL2) may be connected to the first pad area PA1 of the electrode pads (ELp1 and ELp2), respectively.

The second stack structure SST2 may include sacrificial layers SL and the interlayer insulating layers ILD that are alternately and repeatedly stacked in the third direction (z direction) perpendicular to the top snake FS of the substrate 101. As described above, the second stack structure SST2 may be located between two insulating layer dams ID adjacent to each other in the second direction (y direction) in the extension area EA. The second pad area PA2 of the electrode pads (ELp1 and ELp2) may be on a top surface of the second stack structure SST2. The first pad area PA1 and the second pad area PA2 of the electrode pads (ELp1 and ELp2) may be connected to each other on a top surface of the insulating layer dam ID.

The planarized insulating layer 150 may cover the stack structure SST on the substrate 101. The planarized insulating layer 150 may have a substantially flat top surface. In addition, the planarized insulating layer 150 may cover the stepped structure of the stack structure SST or the electrode pads (ELp1 and ELp2) in the extension area EA. The planarized insulating layer 150 may include one insulating layer or a plurality of insulating layers.

A plurality of vertical channel structures VCS having a structure penetrating the stack structure SST may be formed on the substrate 101. The vertical channel structure VCS may be arranged in a zigzag form in the first direction (x direction) in a plan view, for example as shown in FIG. 2. The vertical channel structure VCS may be in the cell array region CAA. However, an arrangement position of the vertical channel structure VCS is not limited thereto. For example, as illustrated in a vertical-type nonvolatile memory device 100a of FIG. 4, the vertical channel structure VCS may be in the extension area EA.

The vertical channel structure VCS may include a lower semiconductor pattern LSP, an upper semiconductor pattern USP, a data storage pattern VP, and a buried insulating pattern VI. The lower semiconductor pattern LSP may directly contact the substrate 101 and may include an epitaxial layer in the form of a pillar grown from the substrate 101. For example, the lower semiconductor pattern LSP may be partially located in the substrate 101. A top surface of the lower semiconductor pattern LSP may be above a top surface of the lowermost gate electrode layer EL1 and may be below a top surface of the lowermost interlayer insulating layer ILD on the lowermost gate electrode layer EL1. A gate insulating layer 115 may be on a portion of a sidewall of the lower semiconductor pattern LSP.

The upper semiconductor pattern USP may directly contact the lower semiconductor pattern LSP. The inside of the upper semiconductor pattern USP may be filled with the buried insulating pattern VI including an insulating material. The lower semiconductor pattern LSP may be connected to the upper semiconductor pattern USP, penetrating the data storage pattern VP.

The data storage pattern VP may be between the stack structure SST and the upper semiconductor pattern USP. The data storage pattern VP may extend in the third direction (z direction) and may surround sidewalls of the upper semiconductor pattern USP. The data storage pattern VP may include one thin layer or a plurality of thin layers. In exemplary embodiments of the inventive concept, the data storage pattern VP may be a data storage layer of a NAND flash memory device and may include a tunnel insulating layer, a charge storage layer, and a blocking insulating layer.

A bit line electrode pad BP and a bit line contact plug BCP connected to the bit line electrode pad BP may be on the upper semiconductor pattern USP. Side surfaces of the bit line electrode pads BP may be surrounded by the data storage pattern VP. For example, the side surfaces of the bit line electrode pads BP may be in direct contact with the data storage pattern VP. According to exemplary embodiments of the inventive concept, the bit line electrode pad BP may be on the top surface of the upper semiconductor pattern USP and a top surface of the data storage pattern VP, and the top of the bit line electrode pad BP may be covered by a first upper interlayer insulating layer 160.

A common source area CSA may be formed by doping an upper portion of the substrate 101 with impurities. The common source area CSA may extend in the first direction (x direction). The common source plug CSP may be formed on and connected to the common source area CSA. The insulating spacer IS may be between the common source plug CSP and the stack structure SST, and the common source plug CSP and the insulating spacer IS may constitute the division area DA. In some exemplary embodiments of the inventive concept, the common source plug CSP may be formed only on a portion of a top surface the common source area CSA, and a separation insulating layer may be on the common source plug CSP. In this structure, the common source plug CSP, the insulating spacer IS, and the separation insulating layer may constitute the division area DA.

The first upper interlayer insulating layer 160 may be on the planarized insulating layer 150 in the extension area EA. In addition, the first upper interlayer insulating layer 160 may cover top surfaces of the vertical channel structures VCS. A second upper interlayer insulating layer 170 may be on the first upper interlayer insulating layer 160 and may cover top surfaces of the common source plugs CSP and the insulating spacer IS.

In the extension area EA, the vertical contact VC may be connected to the corresponding electrode pads (ELp1 and ELp2) by penetrating the first and second upper interlayer insulating layers 160 and 170 and the planarized insulating layer 150. As illustrated in FIGS. 3A and 3B, a vertical length of the vertical contact VC, in other words, a length in the third direction (z direction), may be reduced as the vertical contact VC is closer to the cell array area CAA. For example, as the vertical contact VC gets closer to the cell army area CCA, it may be connected to a higher second stack structure SST2 than the vertical contact VC farther from the cell array area CAA. In addition, the top surfaces of the vertical contacts VC may be substantially coplanar. The vertical contact VC may penetrate the electrode pads (ELp1 and ELp2) and be inserted into the second stack structure SST2 thereunder.

In the second stack structure SST2, the sacrificial layer SL and the interlayer insulating layer ILD may be formed. Accordingly, even when the vertical contact VC is inserted into the second stack structure SST2 via the electrode pads (ELp1 and ELp2), the bridge defect with the gate electrodes layers (EL1 and EL2) that are generated in a conventional vertical nonvolatile memory device may not occur. For example, in the conventional vertical nonvolatile memory device, in an extension area, a gate electrode layer may be under an electrode pad. Accordingly, in the case where a vertical contact extends downward via the electrode pad, a bridge defect may occur when the vertical contact is connected to the gate electrode layer under the electrode pad. In contrast, in the vertical nonvolatile memory device 100 of the present embodiment, since the second stack structure SST2 is under the electrode pads (ELp1 and ELp2) to which the vertical contact VC is connected, the bridge defect with the gate electrode layers (EL1 and EL2) may not occur even though the vertical contact VC penetrates the corresponding electrode pads (ELp1 and ELp2) and extends downward.

In the vertical nonvolatile memory device 100 of the present embodiment, the second stack structure SST2 may be formed due to the insulating layer dam ID. Descriptions on the second stack structure SST2 are given in more detail later when describing the insulating layer dam ID in the extension area EA and the structure of the electrode pads (ELp1 and ELp2).

Sub-bit lines SBL may be on the second upper interlayer insulating layer 170 in the cell array area CAA and may be electrically connected to corresponding vertical channel structures VCS via the bit line contact plugs BCP. In the extension area EA, connection lines CL may be on the second upper interlayer insulating layer 170 and may be connected to the vertical contacts VC. A third upper interlayer insulating layer 180 may be on the second upper interlayer insulating layer 170 and may cover the sub-bit lines SBL and the connection lines CL. The bit lines BL may be on the third upper interlayer insulating layer 180 and may extend in the second direction (y direction) across the stack structure SST. The bit lines BL may be connected to the sub-bit lines SBL via contact plugs.

In the vertical-type nonvolatile memory device 100 of the present embodiment, the structures of the insulating layer dam ID in the extension area EA and the corresponding electrode pads (ELp1 and ELp2) are described in more detail below.

As described above, in the vertical-type nonvolatile memory device 100 of the present embodiment, as the gate electrode layers (EL1 and EL2) are located farther away from the substrate 101 in the third direction (z direction) in the extension area EA, the gate electrode layers (EL1 and EL2) may have the stepped structure in which lengths thereof decrease in the first direction (x direction) in the cell array area CAA. In addition, in the extension area EA, the first and second electrode pads ELp1 and ELp2 connected to the gate electrode layers (EL1 and EL2) may have the raised pad structure. In this case, the raised pad structure may be a structure in which the thicknesses of the electrode pads (ELp1 and ELp2) are greater than those of the corresponding gate electrode layers (EL1 and EL2).

In addition, as shown in FIG. 2, the vertical-type nonvolatile memory device 100 of the present embodiment may include two insulating layer dams ID extending in the first direction (x direction) and being, apart from each other in the second direction (y direction) in the extension area EA. The second stack structure SST2 may be between the two insulating layer dams ID. The second stack structure SST2 may include the sacrificial layer SL and the interlayer insulating layer ILD that are alternately arranged. In the extension area EA, the first stack structure SST1 may be between the isolation area DA and the insulating layer dam ID, and the first stack structure SST1 may include the gate electrode layers (EL1 and EL2) and the interlayer insulating layer ILD that are alternately arranged.

The gate electrode layers (EL1 and EL2) may be connected to the corresponding electrode pads (ELp1 and ELp2) in the extension area EA, and the gate electrode layers (EL1 and EL2) and the first and second electrode pads ELp1 and ELp2 may have a stepped structure in which they increase or decrease by two layers in the extension area EA. In other words, the first electrode pads ELp1 may be separated by two layers in the extension area EA. In the first stack structure SST1, the gate electrode layers (EL1 and EL2) and the interlayer insulating layer ILD may be alternately stacked in the third direction (z direction), and the gate electrode layers (EL1 and EL2) may include an odd-numbered first gate electrode layer EL1 and an even-numbered second gate electrode layer EL2. For example, in FIG. 3A or FIG. 3B, it is illustrated that the first and second gate electrode layers EL1 and EL2 are arranged from a first layer to a ninth layer in the cell array area CAA. However, the number of layers of the first and second gate electrode layers EL1 and EL2 is not limited thereto. For example, the first and second gate electrode layers EL1 and EL2 may be formed in eight layers or less, or in ten layers or more.

The first and second gate electrode layers EL1 and EL2 and the first and second electrode pads ELp1 and ELp2 of the first stack structure SST1 may have a first stepped structure STS1 on the left side with respect to a first pad gap PG1 in the extension area EA, and may have the second stepped structure STS2 on then right side of the first pad gap PG1 in the extension area EA. In other words, the first stepped structure STS1 and the second stepped structure STS2 may be adjacent to each other in the second direction (y direction) with respect to the first pad gap PG1 extending in the first direction (x direction). In addition, the structure of the second stack structure SST2 may be substantially the same as the stepped structure of the first stack structure SST1 in the extension area EA, except that the sacrificial layer SL is included instead of the gate electrode layers EL1 and EL2. More specifically, the sacrificial layer SL is used in place of the gate electrode layers EL1 and EL2 in the second stacked structure SST2. As shown in FIG. 3B, the sacrificial layer SL and the first and second electrode pads ELp1 and ELp2 of the second stack structure SST2 may have the first stepped structure STS1 on the left side of the first pad gap PG1 in the extension area EA, and may have the second stepped structure STS2 on the right side of the first pad gap PG1 in the extension area EA.

In the first stepped structure STS1, lengths of the first and second gate electrode layers EL1 and EL2 may decrease in the order of a first layer, second-third layers, fourth-fifth layers, sixth-seventh layers, and eighth-ninth layers in the first direction (x direction). The first layer and upper layers of pairs of two layers, in other words, third layer, fifth layer, seventh layer, and ninth layer, may correspond to the first gate electrode layer EL1, and lower layers of pairs of two layers, in other words, second layer, fourth layer, sixth, layer, and eighth layer, may correspond to the second gate electrode layer EL2. In addition, the first gate electrode layer EL1 corresponding to the upper layer may constitute the first electrode pad ELp1 in the extension area EA. In this case, portions connected by may mean the first and second gate electrode layers EL1 and EL2 have the same length in the first direction (x direction). For example, the "second-third layer" may mean that the first and second gate electrode layers EL1 and EL2 of the second and third layers have the same length in the first direction (x direction).

In the second stepped structure STS2, the lengths of the first and second gate electrode layers EL1 and EL2 may decrease in the order of first-second layers, third-fourth layers, fifth-sixth layers, and seventh-eighth layers in the first direction (x direction). Upper layers among the pairs of two layers, in other words, the second, the fourth, the sixth, and the eighth layers, may correspond to the second gate electrode layer EL2, and lower layers among the pairs of two layers, in other words, the first, the third, the fifth, and seventh layers, may correspond to the first gate electrode layer EL1. In addition, the second gate electrode layer EL2 corresponding to the upper layers may constitute the second electrode pad ELp2 in the extension area EA.

When one block of the cell array area CAA is between two adjacent division areas DA, all the first and second gate electrode layers EL1 and EL2 in the block may be connected to the vertical contact VC via the first and second stepped structures STS1 and STS2 and the first and second electrode pads ELp1 and Elp2. In addition, in the extension area EA, by dividing the first and second electrode pads ELp1 and Elp2 in the second direction (y direction) with respect to the first pad gap PG1 by using the first and second stepped structures STS1 and STS2, the vertical contacts VC may be arranged in two rows in the first direction (x direction). Accordingly, a process margin may be sufficiently secured by further widening an arrangement interval of the vertical contacts VC in the first direction (x direction).

In FIG. 3B, as illustrated by a portion taken along the line IV-IV', the first electrode pad ELp1 may be on the left-side of the ninth layer of the first pad gap PG1 of the first and second electrode pads ELp1 and ELp2 closest to the cell array area CAA. In addition, the first and second gate electrode layers EL1 and EL2 of the first through eight layers may be under the first electrode pad ELp1. However, as the first and second gate electrode layers EL1 and EL2 of the first through eighth layers are lowered by two layers along with the first electrode pad ELp1, the first and second gate electrode, layers EL1 and EL2 may extend farther from the cell array area CAA in the first direction (x direction). In other words, the second gate electrode layer EL2 of the eighth layer may have the same length as the first electrode pad ELp1 of the ninth layer in the first direction (x direction) and may extend shortest of the first to ninth layers, each of the first and second electrode layers EL1 and EL2 of the sixth and seventh layers, the first and second electrode layers EL1 and EL2 of the fourth and fifth layers, and the first and second electrode layers EL1 and EL2 of the second and third layers may have the same length in the first direction (x direction), and the first and second electrode layers EL1 and EL2 may extend longer in the cell array area CAA as the number of layers is reduced, and the first gate electrode layer EL1 of the first layer may extend farthest of the first to ninth layers.

In addition, of the first and second electrode pads ELp1 and ELp2 closest to the cell array area CAA, the second electrode pad ELp2 may be the eighth layer at the right-side of the first pad gap PG1, and the first and second electrode layers EL1 and EL2 of the first through seventh layers may be under the second electrode pad ELp2. In addition, as the first and second gate electrode layers EL1 and EL2 of the first through seventh layers are lowered by two layers along with the second electrode pad ELp2, the first and second gate electrode layers EL1 and EL2 may extend further from the cell array area CAA in the first direction (x direction). In other words, the first gate electrode layer EL1 of the seventh layer may have the same length as the second electrode pad ELp2 of the eighth layer in the first direction (x direction) and may extend shortest of the first to eighth layers, each of the first and second electrode layers EL1 and EL2 of the fifth and sixth layers, the first and second electrode layers EL1 and EL2 of the third and fourth layers, and the first and second electrode layers EL1 and EL2 of the first and second layers may have the same length in the first direction (x direction), and may extend longer in the cell array area CAA as the number of layers is reduced.

In FIG. 3B, in the case of a portion taken along the line V-V', the first electrode pad ELp1 and the second electrode pad ELp2 may be lower by two layers than the first electrode pad ELp1 and the second electrode pad ELp2 in a portion taken along the line IV-IV', respectively. In other words, of the first and second electrode pads ELp1 and ELp2 second closest to the cell array area CAA, the first electrode pad ELp1 may be the seventh layer at the left-side of the first pad gap PG1, and the first and second electrode layers EL1 and EL2 of the first through sixth layers may be under the first electrode pad ELp1. In addition, the second electrode pad ELp2 may be the sixth layer at the right-side of the first pad gap PG1, and the first and second gate electrode layers EL1 and EL2 of the first through fifth layers may be under the second electrode pad ELp2.

The first and second electrode pads ELp1 and ELp2 may be apart from each other with the second pad gap PG2 from side end portions (ELe1 and ELe2) of the stepped structure toward the cell array area CAA in the first direction (x direction). For example, in FIG. 3A, the first electrode pad ELp1 may be apart with the second pad gap PG2 from a first side end portion ELe1 of the left-side stepped structure.

The first and second electrode pads ELp1 and ELp2 may be divided into the first pad area PA1 and the second pad area PA2 based on the insulating layer dam ID, respectively. As illustrated in FIG. 3B, the first pad area PA1 may be thicker than the second pad area PA2 in the third direction (z direction). A lower portion of the first pad area PA1 may be in contact with the side surface of the insulating layer dam ID, and an upper portion of the first pad area PA1 may be connected to the second pad area PA2 on the upper surface of the insulating layer dam ID. For example, the first and second pad areas PA1 and PA2 may be connected by the first electrode pad ELp1. In addition, as illustrated in a portion taken along the line IIII-III' in FIG. 3A, the lower portion of the first pad region PA1 of the first electrode pad ELp1 may be connected to the first gate electrode layer EL1. In addition, the lower portion of the first pad area PA1 of the second electrode pad ELp2 may be connected to the second gate electrode layer EL2.

The second gate electrode layer EL2 may be arranged under the first electrode pad ELp1 with the interlayer insulating layer ILD interposed therebetween, but the second gate electrode layer EL2 may not be connected to the first electrode pad ELp1. In addition, the first gate electrode layer EL1 may be arranged under the second electrode pad ELp2 with the interlayer insulating layer ILD interposed therebetween, but the first gate electrode layer EL1 may not be connected to the second electrode pad ELp2.

In the vertical-type nonvolatile memory device 100 of the present embodiment, the first and second electrode pads ELp1 and ELp2 that are raised and have a stepped structure may be formed in the first direction (x direction) in the extension area EA. In addition, two insulating layer dams ID apart from each other in the second direction (y direction) perpendicular to the first direction (x direction) may be formed. In addition, since the first and second gate electrode layers EL1 and EL2 are not replaced under the first and second electrode pads ELp1 and ELp2 between the two insulating layer dams ID, the second stack structure SST2 in which the sacrificial layer SL and the interlayer insulating layer ILD are alternately formed may be maintained in its current state. Accordingly, in the vertical-type nonvolatile memory device 100 of the present embodiment, in a process of forming the vertical contact VC in the extension area EA, although the vertical contact VC is formed by penetrating the first and second electrode pads ELp1 and ELp2, the bridge defect in which the vertical contacts VC are connected to the first and second gate electrode layers EL1 and EL2 under the first and second electrode pads ELp1 and ELp2 may not occur, and as a result, a vertical-type nonvolatile memory device having improved reliability may be implemented.

For reference, in a conventional vertical-type nonvolatile memory device, a pull back (P/B) etch dispersion of an etchant may increase in a gate electrode layer replacement process according to the dispersion related with forming a raised electrode pad. In this case, a connection margin between a pad and a vertical contact may be reduced. In addition, when the vertical contact is formed in an electrode pad portion having the minimum margin, a bridge defect in which the vertical contact is connected to a lower gate electrode layer by penetrating the electrode pad portion may occur.

However, in the vertical nonvolatile memory device 100 of the present embodiment, the insulating layer dam ID is formed in the extension area EA before the gate electrode layer replacement process, and the mold structure is kept between the insulating layer dams ID in the gate electrode layer replacement process. In this case, the P/B etching of the etching solution for the gate electrode layer of the lower portion may be limited by the insulating layer dam ID, while the P/B etching of the etching solution for the electrode pad of the upper portion is increased regardless of dispersion due to the formation of the raised electrode pad. Accordingly, the vertical-type nonvolatile memory device 100 of the present embodiment may improve the connection margin and eliminate the bridge defect.

Figure 4:
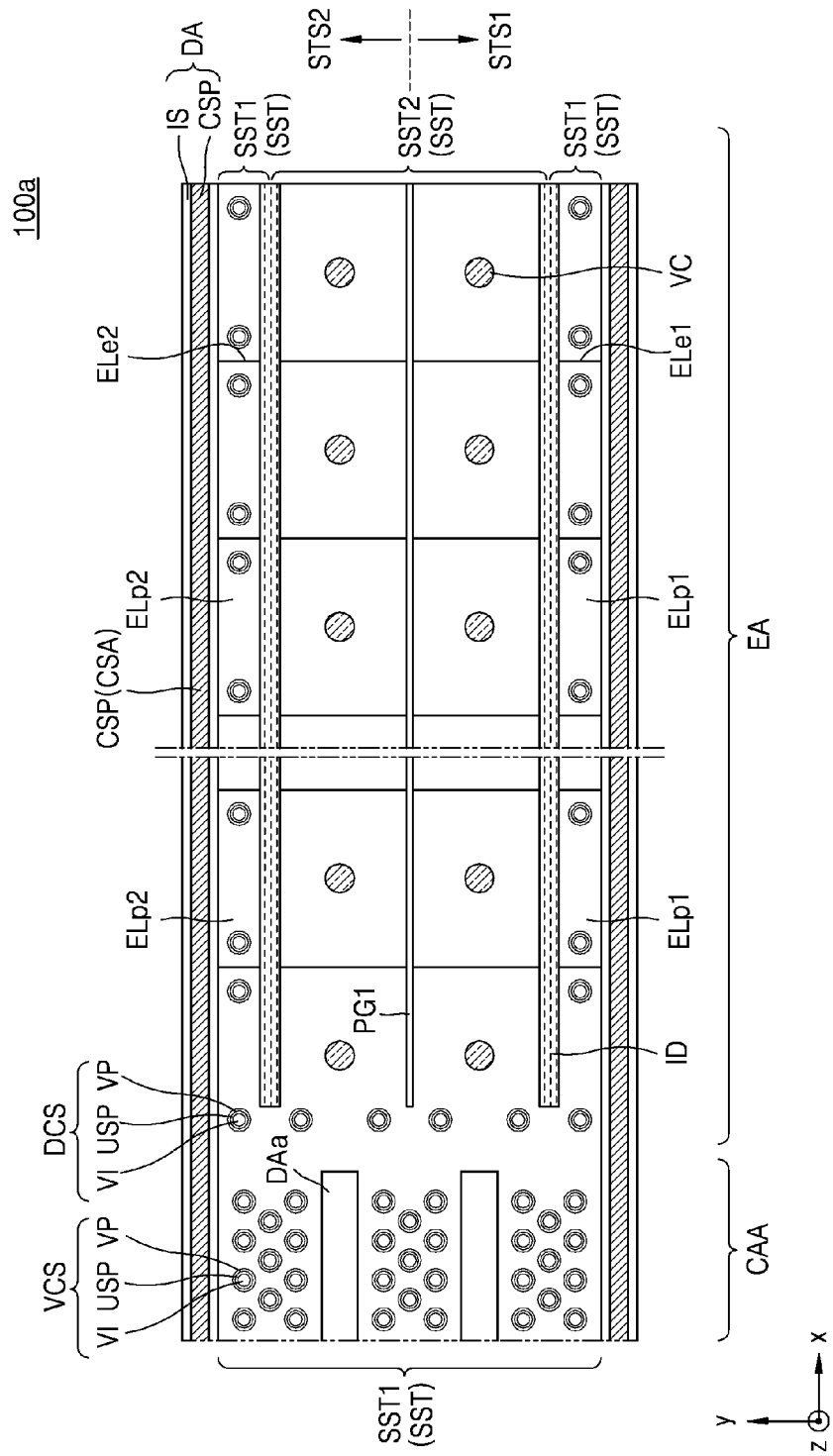
FIG. 4 is a plan view illustrating a vertical-type nonvolatile memory device, according to an exemplary embodiment of the inventive concept.

FIG. 4 is a plan view of a vertical-type nonvolatile memory device 100a according to an exemplary embodiment of the inventive concept, and may correspond to the plan view of FIG. 2. The descriptions already given with reference to FIGS. 1 through 3B are briefly given or omitted.

Referring to FIG. 4, the vertical-type nonvolatile memory device 100a of the embodiment may be different from the vertical-type nonvolatile memory device 100 of FIG. 2, in that a dummy channel structure DCS is arranged in the extension area EA. In the vertical-type nonvolatile memory device 100a of the present embodiment, the dummy channel structure DCS may be in a portion in which the first stack structure SST1 is formed in the extension area EA. In the extension area EA, the first stack structure SST1 may be formed between the insulating layer dam ID and the division area DA, and in the portion of the extension area EA adjacent to the cell array area CAA.

The dummy channel structure DCS may be formed to prevent the interlayer insulating layer ILD from collapsing in the replacement process of the gate electrode layers (refer to EL1 and EL2 in FIG. 3A). Accordingly, the dummy channel structure DCS may be formed in a portion where the first stack structure SST1 is formed in the replacement process of the gate electrode layers (EL1 and EL2). On the other hand, in the replacement process of the gate electrode layers (EL1 and EL2), since the second stack structure SST2 is maintained as is between the two insulating layer dams ID adjacent to each other in the second direction (y direction), the dummy channel structure DCS may not be arranged in the second stack structure SST2.

The dummy channel structure DCS may have a structure substantially the same as that of the vertical channel structure (refer to VCS in FIG. 2). For example, in the third direction (z direction), the bottom surfaces of the vertical channel structure VCS and the dummy channel structure DCS may be at substantially the same level. In addition, the vertical channel structure VCS and the dummy channel structure DCS may have substantially the same length in the third direction (z direction). This may be because the vertical channel structure VCS and the dummy channel structure DCS are simultaneously formed in the same process.

Since the dummy channel structure DCS is formed in the extension area EA, unlike the vertical channel structure VCS that penetrates the entire first stack structure SST1, the dummy channel structure DCS may have a structure that penetrates the planarized insulating layer 150 (refer to FIG. 3A) and the first stack structure SST1 under the planarized insulating layer 150. For example, the dummy channel structure DCS may penetrate through the stepped structure of the first stack structure SST1, and as the dummy channel structure DCS becomes farther away from the cell array area CAA, the number of gate electrode layers (EL1 and EL2) through which the dummy channel structure DCS penetrates may be reduced.

An internal structure of the dummy channel structure DCS may be substantially the same as the vertical channel structure VCS. Accordingly, the dummy channel structure DCS may include the lower semiconductor pattern (refer to LSP in FIG. 2), the upper semiconductor pattern (refer to USP of FIG. 2), the data storage pattern (refer to VP of FIG. 2), and the buried insulating pattern (refer to VI in FIG. 2). In some exemplary embodiments of the inventive concept, in the dummy channel structure DCS, the upper semiconductor pattern USP may be removed, and the buried insulation pattern VI may be arranged directly on the data storage pattern VP.

Figure 5:
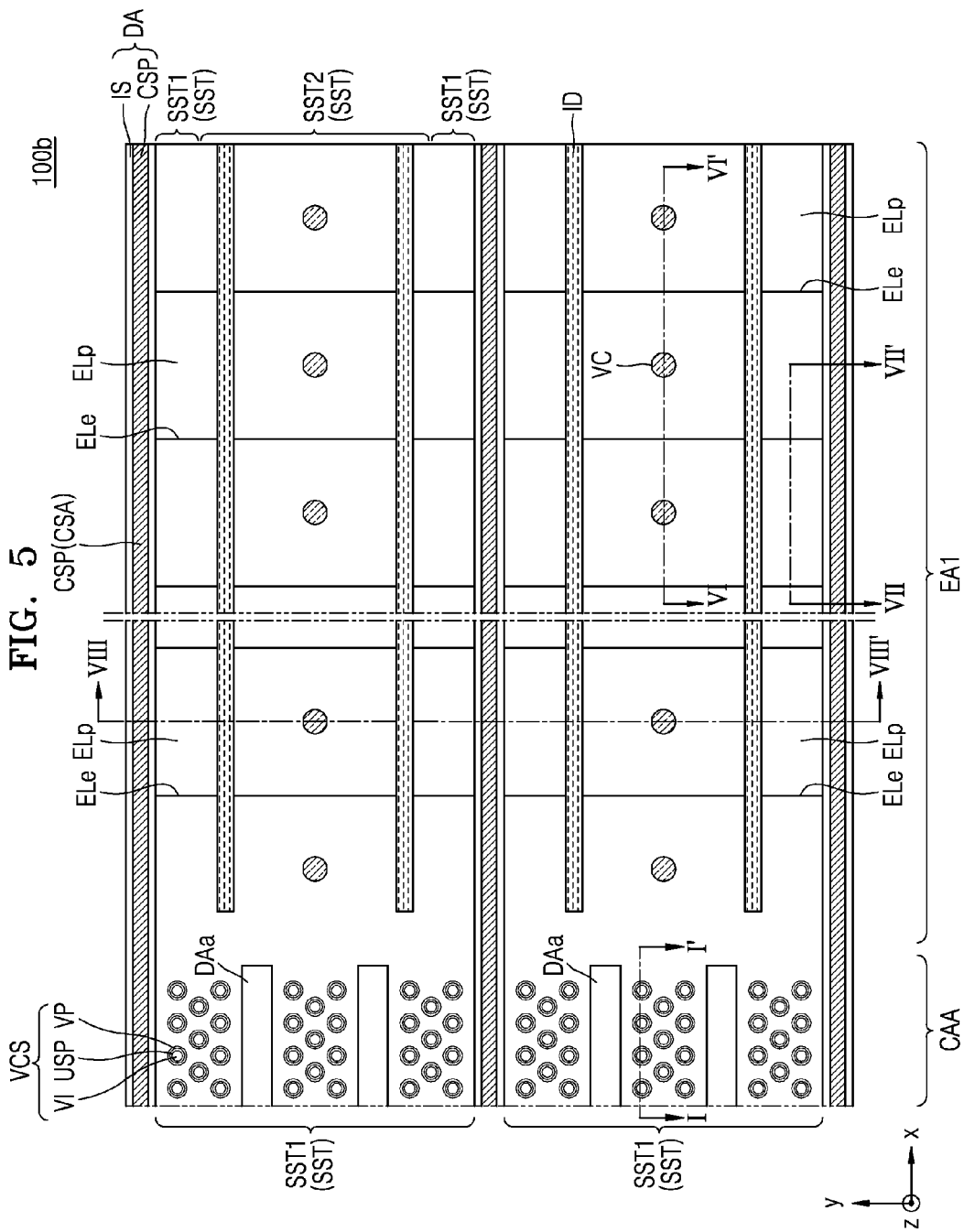
FIG. 5 is a plan view illustrating a vertical-type nonvolatile memory device, according to an exemplary embodiment of the inventive concept.
Figure 6A:
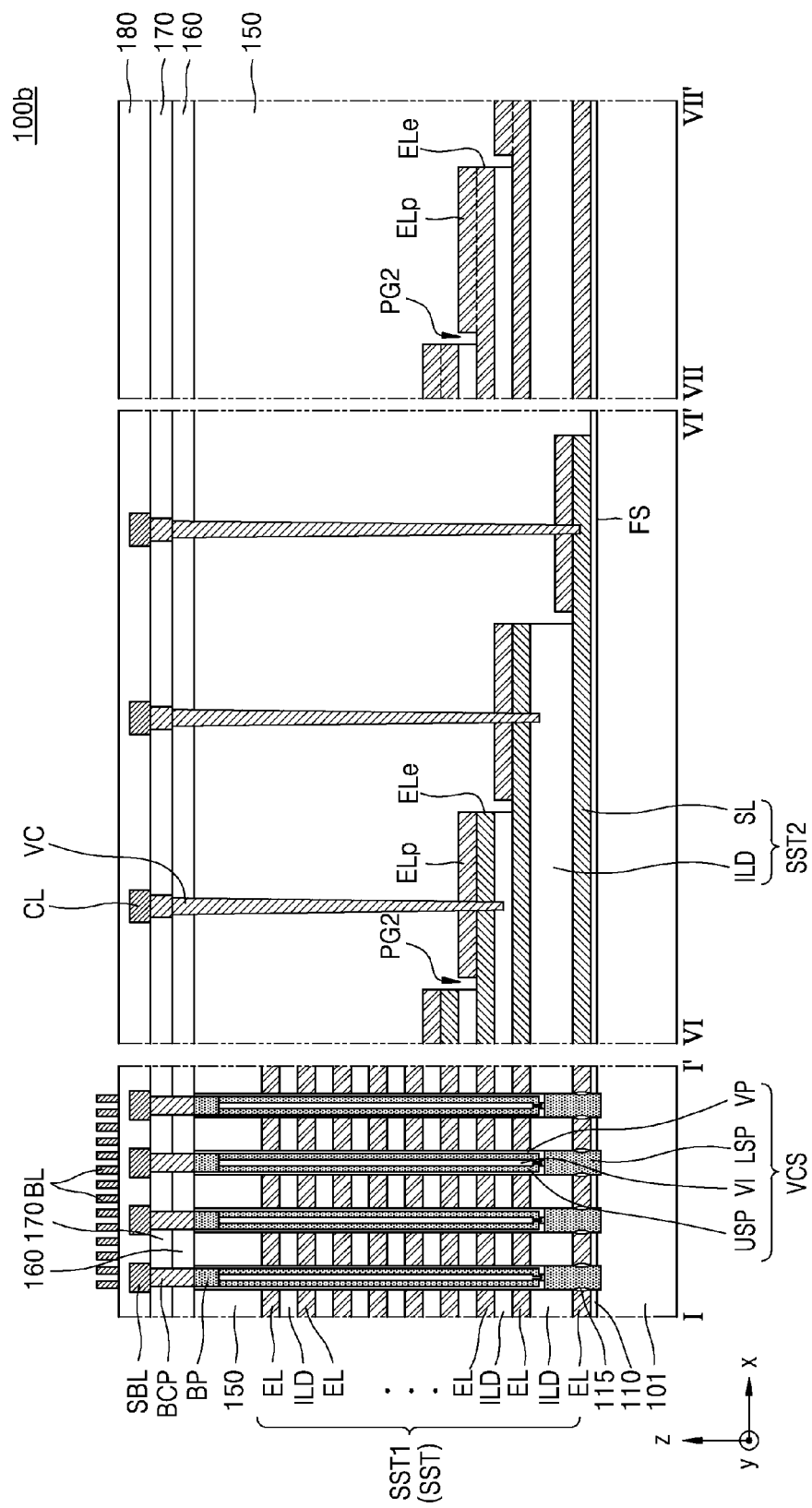
FIG. 6A is a cross-sectional view illustrating the vertical-type nonvolatile memory device of FIG. 5 taken along lines I-I', VI-VI', and VII-VII'.
Figure 6B:
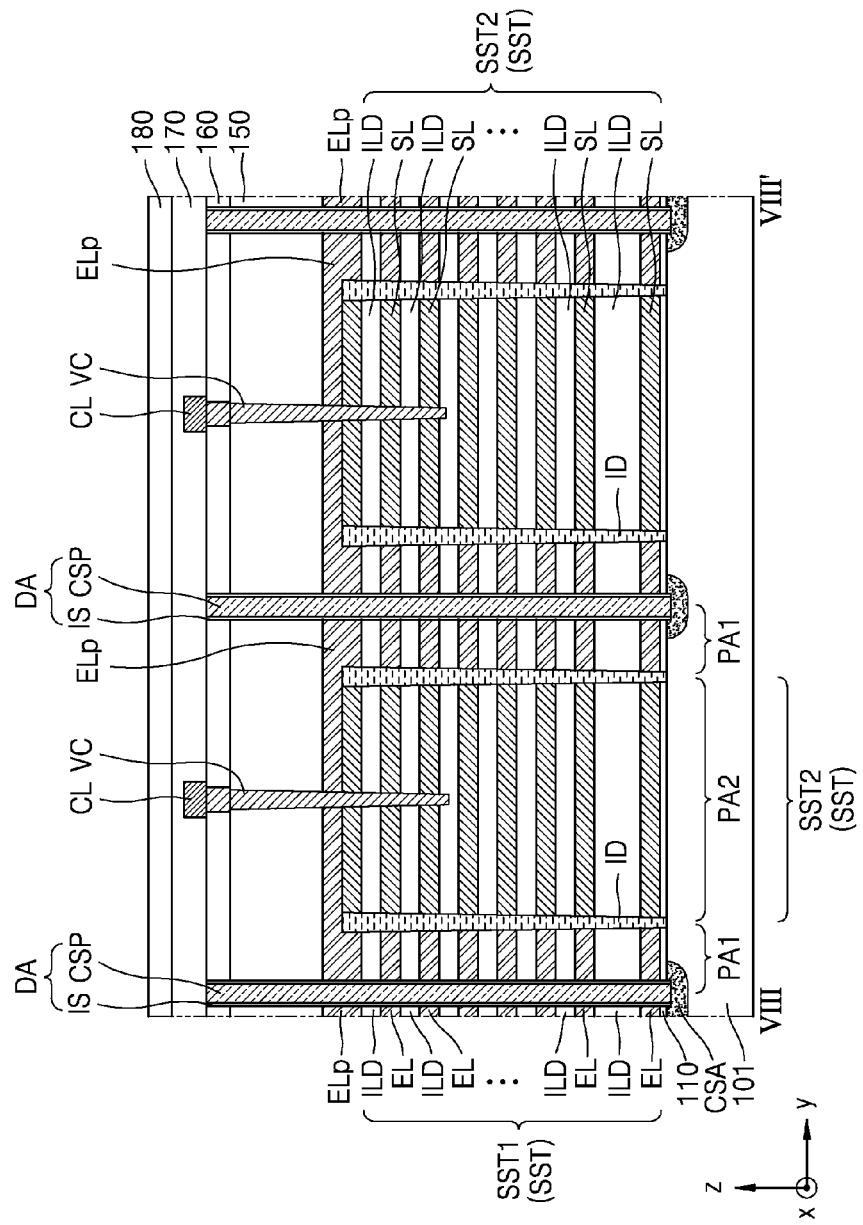
FIG. 6B is a cross-sectional view illustrating the vertical-type nonvolatile memory device of FIG. 5 taken along line VIII'-VIII'.

FIG. 5 is a plan view of a vertical-type nonvolatile memory device 100b according to an exemplary embodiment of the inventive concept, FIG. 6A illustrates cross-sectional views taken along the lines I-I', VI-VI', and VII-VII' of the vertical-type nonvolatile memory device 100b of FIG. 5, and FIG. 6B illustrates a cross-sectional view taken along line VIII-VIII' of the vertical-type nonvolatile memory device 100b of FIG. 5. Descriptions already given with reference to FIGS. 1 through 4 are briefly given or omitted.

Referring to FIGS. 5 through 6B, the vertical-type nonvolatile memory device 100b of the present embodiment may be different from the vertical-type nonvolatile memory device 100 of FIG. 2, in a structure of the gate electrode layers (EL) and the electrode pad ELp in an extension area EL1. In the vertical-type nonvolatile memory device 100b of the present embodiment, in the extension area EA1, the gate electrode layers (EL) and the electrode pad ELp may have a stepped structure that increases or decreases by one layer in the first direction (x direction). Accordingly, the gate electrode layers (EL) in the cell array area CAA of one block between two adjacent division areas DA may be connected to the corresponding electrode pad ELp via a single stepped structure of the extension area EA1.

For example, in FIGS. 6A and 6B, the gate electrode layers (EL) of first through ninth layers may be arranged in the cell array area CAA. The number of layers of the gate electrode layers (EL) is not limited thereto. For example, the gate electrode layers (EL) may be formed in eight layers or less, or ten layers or more. In the stepped structure of the extension area EA1, lengths of the gate electrode layers (EL) may be sequentially increased by one layer in the first direction (x direction). In addition, the gate electrode layer (EL) of each layer may constitute the electrode pad ELp in the extension area EA1, and the vertical contacts VC may be arranged in a line in the first direction (x direction).

As illustrated in the portion taken along the line VIII-VIII in FIG. 6B, the electrode pad ELp may be the eighth layer in the electrode pad ELp second closest to the cell array area CAA, and the gate electrode layers (EL) of the first through seventh layers may be under the electronic pad ELp. The gate electrode layers (EL1 and EL2) of the first through seventh layers together with the electrode pad ELp may extend farther from the cell array area CAA in the first direction (x direction) as they are lowered by one layer. In other words, the electrode pad ELp of the eighth layer extend the shortest distance in the first direction (x direction), and as the number of layers of the gate electrodes (EL) is lowered from the seventh layer to the first layer, the gate electrode layer (EL) may extend farther away from the cell array area CAA.

In the vertical-type nonvolatile memory device 100b of the present embodiment, in the extension area EA1, between two division areas DA adjacent to each other in the second direction (y direction), two insulating layer dams ID that extend in the first direction (x direction) and are apart from each other in a second direction (y direction) may be formed. Similarly to the vertical-type nonvolatile memory device 100 of FIG. 2, the second stack structure SST2 may be arranged between two insulating layer dams ID. In other words, the first stack structure SST1 in which the gate electrode layers (EL) and the interlayer insulating layer ILD are alternately arranged may be in cell array area CAA and between the insulating layer dam ID and the division area DA. In addition, the second stack structure SST2 in which the sacrificial layer SL and the interlayer insulating layer ILD are alternately arranged may be between the two insulating layer dams ID.

In the vertical-type nonvolatile memory device 100b of the present embodiment, the electrode pad ELp may have the raised pad structure. Accordingly, the electrode pad ELp may be divided into a first pad area PA1 and a second pad area PA2 based on the insulating layer dam ID. For example, the second pad area PA2 may be disposed between a pair of insulating layer dams ID. As illustrated in FIG. 6B, the first pad area PA1 may be thicker than the second pad area PA2 in the third direction (z direction). A lower portion of the first pad area PA1 may be in contact with the side surface of the insulating layer dam ID, and an upper portion of the first pad area PA1 may be connected to the second pad area PA2 on the upper surface of the insulating layer dam ID. In addition, as illustrated in the portion taken along the line VII-VII' in FIG. 6A, the lower portion of the first pad area PA1 of the electrode pad ELp may be connected to the gate electrode layers (EL).

In addition, in the vertical-type nonvolatile memory device 100b of the present embodiment, the dummy channel structure (refer to DCS in FIG. 4) may be in the extension area EA1. For example, as illustrated in the vertical-type nonvolatile memory device 100a of FIG. 4, in the extension area EA1, the dummy channel structure DCS may be arranged in the portion where the first stack structure SST1 is formed, in other words, a portion between the insulating layer dam ID and the division area DA and in the extension area EA1 portion adjacent to the cell array area CAA.

Figure 7:
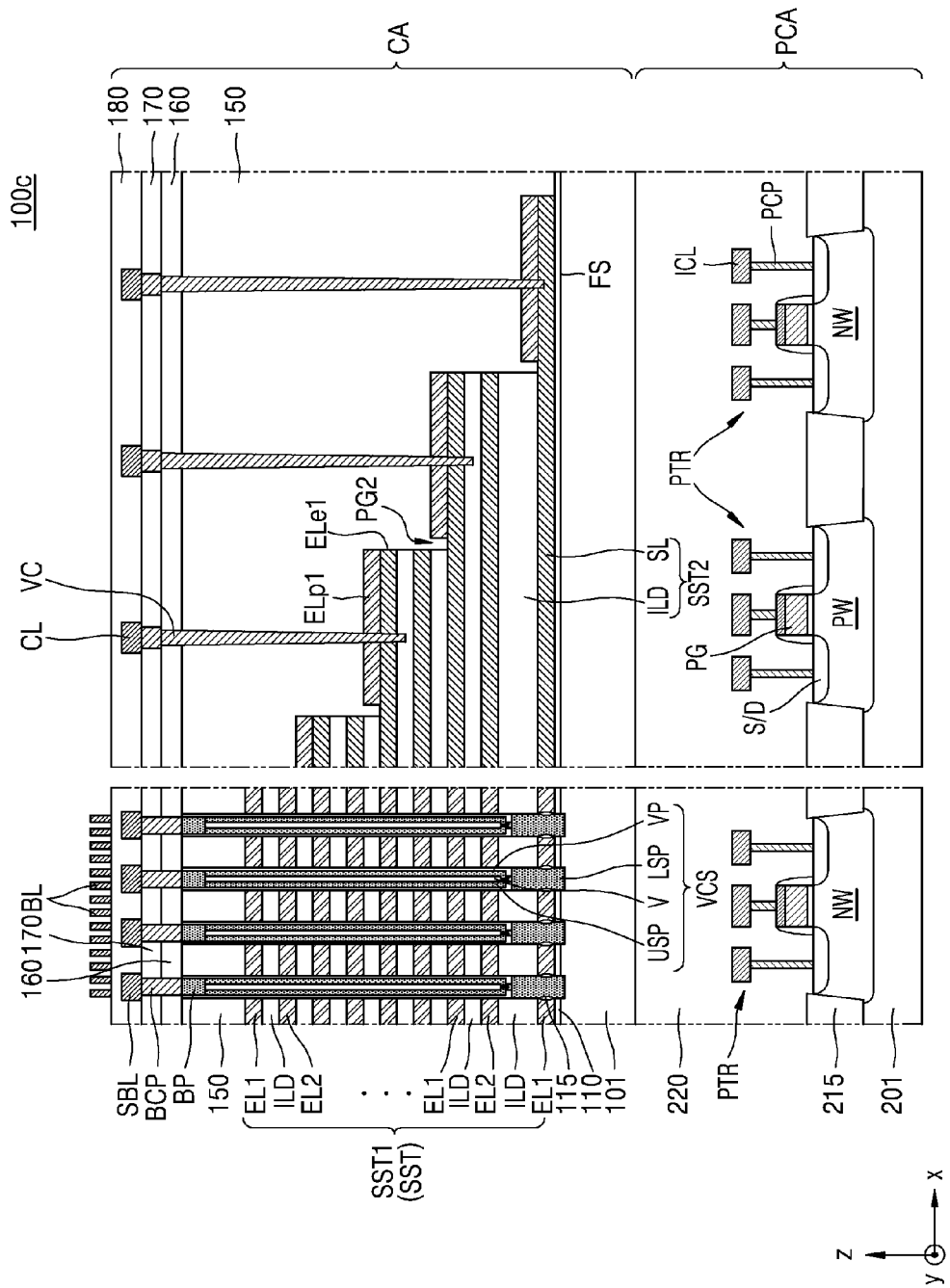
FIG. 7 is a cross-sectional view illustrating a vertical-type nonvolatile memory device, according to an exemplary embodiment of the inventive concept.

FIG. 7 is a cross-sectional view illustrating a vertical-type nonvolatile memory device 100c, according to an exemplary embodiment of the inventive concept. Descriptions already given with reference to FIGS. 1 through 6B are briefly given or omitted.

Referring to FIG. 7, the vertical-type nonvolatile memory device 100c, according to the present embodiment may include a cell area CA and a peripheral circuit area PCA. The cell area CA may have a structure, for example, substantially the same as that of the cell area of the vertical-type nonvolatile memory device 100 of FIG. 2. Accordingly, in FIG. 7, a portion corresponding to the cell area CA may be substantially the same as the portions taken along the lines I-I' and II-II' in FIG. 3A. The structure of the cell area CA of the vertical-type nonvolatile memory device 100c of the present embodiment is not limited to the structure of the cell area of the vertical-type nonvolatile memory device 100 of FIG. 2. For example, the structure of the cell area CA of the vertical-type nonvolatile memory device 100c of the present embodiment may adopt the structures of the cell areas of the vertical-type nonvolatile memory devices 100a and 100b of FIGS. 4 and 5.

In the vertical-type nonvolatile memory device 100c of the present embodiment, the peripheral circuit area PCA may be under the substrate 101 of the cell area CA. In other words, the cell area CA may be stacked on the peripheral circuit area PCA. Thus, the peripheral circuit area PCA and the cell area CA may overlap on each other in a plan view. For reference, in the vertical-type nonvolatile memory devices 100, 100a, and 100b of FIGS. 2, 4, and 5, respectively, the peripheral circuit area PCA may be arranged around the cell area on the top surface FS of the substrate 101 in a horizontal direction.

The peripheral circuit area PCA may be formed on a base substrate 201. The base substrate 201 may be similar to the substrate 101 of the vertical-type nonvolatile memory device 100 of FIG. 2. The base substrate 201 may include an n-well region NW doped with n-type impurities and a p-well region PW doped with Hype impurities. Active regions may be defined in the n-well region NW and the p-well region PW by a device isolation layer 215.

In the peripheral circuit area PCA, a high voltage and/or low voltage transistor and a passive element such as a resistor or a capacitor may be arranged. The peripheral circuit area PCA may include a peripheral circuit gate electrode PG, a source/drain area S/D, a peripheral circuit plug PCP, a peripheral circuit wiring ICL, and a lower buried insulating layer 220. The lower buried insulating layer 220 may include a single layer or multiple layers. A p-type metal oxide semiconductor (PMOS) transistor may be formed in the n-well region NW, and an n-type MOS (NMOS) transistor may be formed in the p-well region PW. The transistors in the peripheral circuit area PCA are denoted by PTR, for example. In addition, in the extension area EA of the cell area CA, a wiring structure for electrically connecting the cell area CA and the peripheral circuit area PCA may be provided. The wiring structure may include a connection contact plug penetrating the planarized insulating layer 150 and the substrate 101 and being connected to the peripheral circuit wiring ICL of the peripheral circuit area PCA.

FIGS. 8 through 17B are cross-sectional views illustrating a method of fabricating the vertical-type nonvolatile memory device of FIG. 2. FIGS. 11A, 12A, 13A, 15A, and 17A may correspond to the portions I-I' and II-II' of FIG. 3A, and FIGS. 8, 9, 10, 11B, 12B, 13B, 14, 15B, 16, and 17B may correspond to FIG. 3B. Descriptions are given with reference to FIGS. 1 through 3B together, and the descriptions already given with reference to FIGS. 1 through 3B are briefly given or omitted. For example, with reference to FIGS. 8, 9, 10, and 14, the drawings correspond to the portions taken along the lines I-I' and II-II' in FIG. 3A are the same as the drawings corresponding to FIG. 3B or the drawings for previous processes, and thus their descriptions are omitted.

Figure 8:
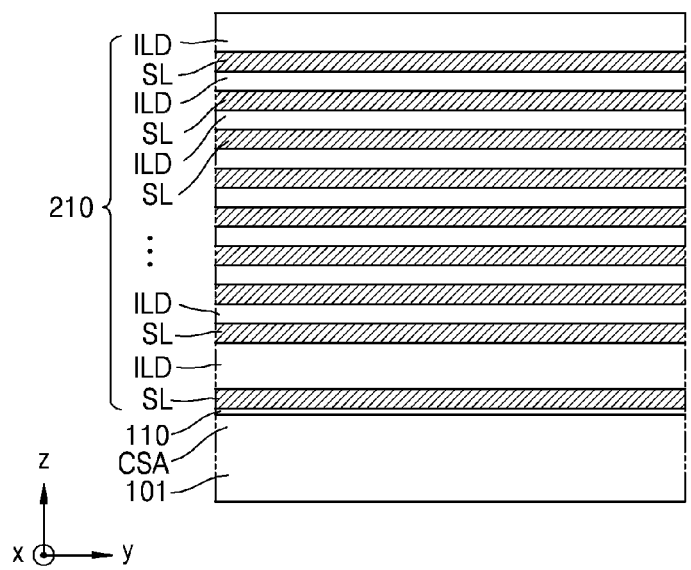
FIGS. 8, 9, 10, 11A, 11B, 12A, 12B, 13A, 13B, 14, 15A, 15B, 16, 17A and 17B are cross-sectional views illustrating a method of fabricating the vertical-type nonvolatile memory device of FIG. 2.

Referring to FIG. 8, a mold structure 210 may be formed on the substrate 101 of the cell array area CAA and the extension area EA. The mold structure 210 may include the sacrificial layer SL and the interlayer insulating layer ILD that are vertically alternately stacked. In the mold structure 210, the sacrificial layer SL may include a material having an etch selectivity with respect to the interlayer insulating layer ILD. For example, the sacrificial layer SL may include silicon nitride, and the interlayer insulating layer ILD may include silicon oxide. The materials of the sacrificial layer SL and the interlayer insulating layer ILD are not limited thereto. The sacrificial layers SL may have substantially the same thickness, and the interlayer insulating layers ILD may have different thicknesses in some areas.

In addition, in the case of the vertical-type nonvolatile memory device 100c illustrated in FIG. 7, after forming the peripheral circuit area PCA under the substrate 101, the mold structure 210 may be formed on the substrate 101. According to an exemplary embodiment of the inventive concept, after forming the peripheral circuit area PCA and the cell area CA on different wafers from each other, the vertical-type nonvolatile memory device 100c may be manufactured in a manner of stacking a second wafer on a first wafer and connecting them to each other via a wiring structure.

Figure 9:
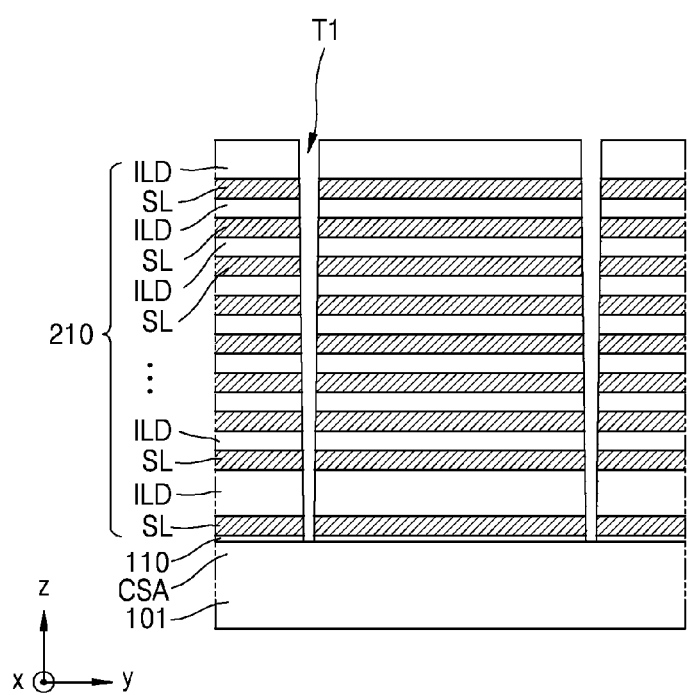

Referring to FIG. 9, after the mold structure 210 is formed, in the extension area EA, first trenches T1 that are extended in the first direction (x direction) and are apart from each other in the second direction (y direction) may be formed in the extension area EA. As illustrated in FIG. 2 or 4, the first trench T1 may be formed between two division areas DA to be formed later or two second trenches (refer to T2 in FIG. 14) for dividing areas. The first trench T1 may be formed to penetrate the mold structure 210 and expose the top surface portion of the substrate 101.

Figure 10:
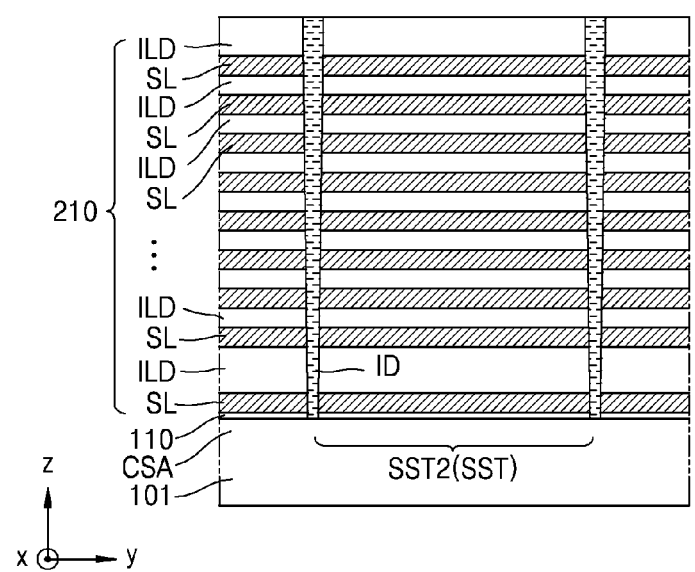

Referring to FIG. 10, the insulating layer dam ID may be formed by filling the first trenches T1 with an insulating material. The insulating layer dam ID may include an oxide, for example, silicon oxide. The material of the insulating layer dam ID is not limited thereto. Since the insulating layer dam ID is formed in the first trench T1, the insulating layer dams ID may have a structure that, in the extension area EA, extends in the first direction (x direction) and are apart from each other in the second direction (y direction). In the extension area EA, the second stack structure SST2 may be between two insulating layer dams ID in the second direction (y direction).

Figure 11A:
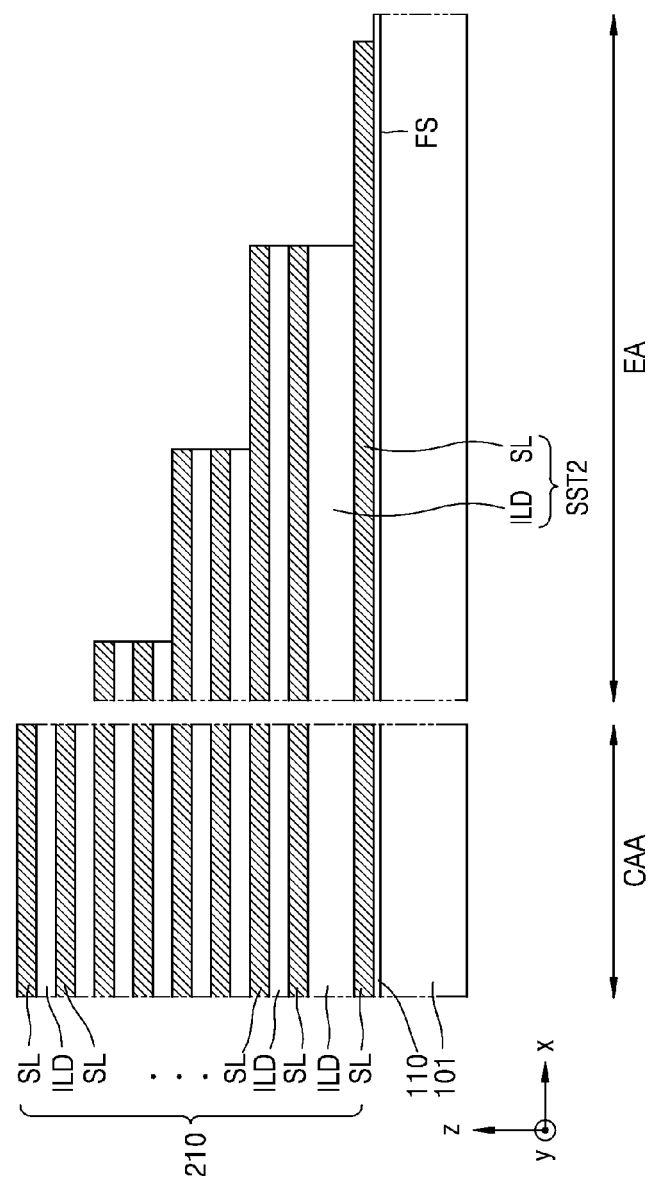
Figure 11B:
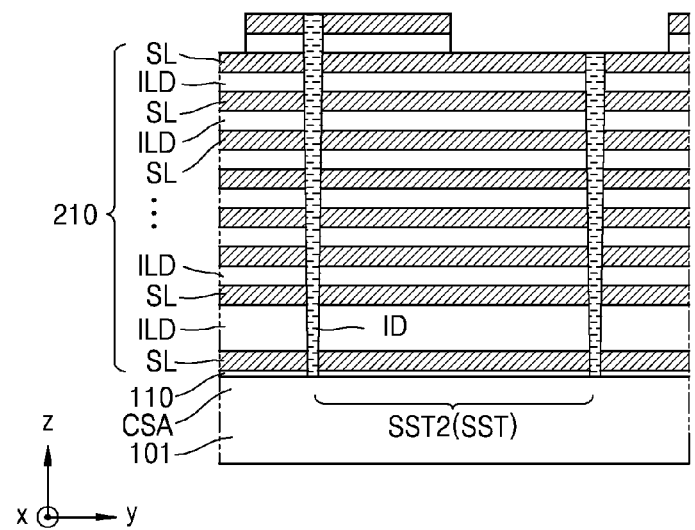

Referring to FIGS. 11A and 11B, a trimming process may be performed on the mold structure 210 to form a stepped structure in the extension area EA. In this case, although the trimming process includes forming a mask pattern covering the mold structure 210 in the cell array area CAA and the extension area EA, etching a portion of the mold structure 210, and reducing a horizontal area of the mask pattern, the process of etching a portion of the mold structure 210 and the process of reducing the horizontal area of the mask pattern may be alternately repeated. After performing the trimming process, the mold structure 210 may have a stepped structure in the extension area EA. For example, the second stack structure SST2 may have a staircase shape in the extension area EA.

In this case, the stepped structure in the extension area EA may include the first stepped structure STS1 and the second stepped structure STS2. Each of the first stepped structure STS1 and the second stepped structure STS2 may have a stepped structure that increases or decreases by two layers. In addition, the first stepped structure STS1 and the second stepped structure STS2 may have a difference of one layer at the same position in the first direction (x direction). Accordingly, the top surface of the odd-numbered sacrificial layer SL may be exposed in the first stepped structure STS1, and the top surface of the even-numbered sacrificial layer SE may be exposed in the second stepped structure STS2. FIG. 11A illustrates the first stepped structure STS1, and in FIG. 11B, the left portion may correspond to the first stepped structure STS1 and the right portion may correspond to the second stepped structure STS2. For example, the left half of the structure of FIG. 11B may correspond to the first stepped structure STS1, while the right half of the structure of FIG. 11B may correspond to the second stepped structure STS2.

In the trimming process, the upper portion of the insulating layer dam ID may be etched, and in the stepped structure of the extension area EA, the top surface of the insulating layer dam ID may be at the same level as the top surface of the exposed sacrificial layer SL. For example, in the first stepped structure STS1, the top surface of the insulating layer dam ID may be coplanar with the top surfaces of the odd-numbered sacrificial layers SL, and in the second stepped structure STS2, the top surface of the insulating layer dam ID may be coplanar with the top surfaces of even-numbered sacrificial layers SL.

The stepped structure of the extension area EA is not limited to a stepped structure that increases or decreases by two layers. For example, the stepped structure of the extension area EA may have a stepped structure that increases or decreases by one layer. When the extension area is formed in the stepped structure, the vertical-type nonvolatile memory device 100b of FIG. 5 may be manufactured.

Figure 12A:
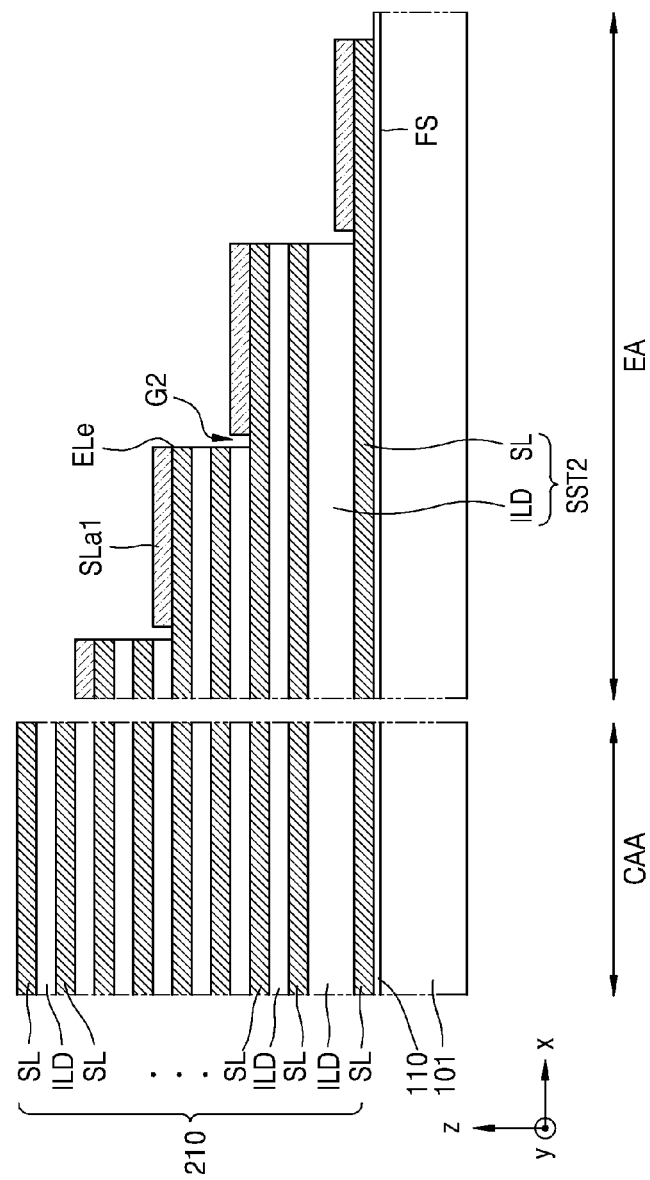
Figure 12B:
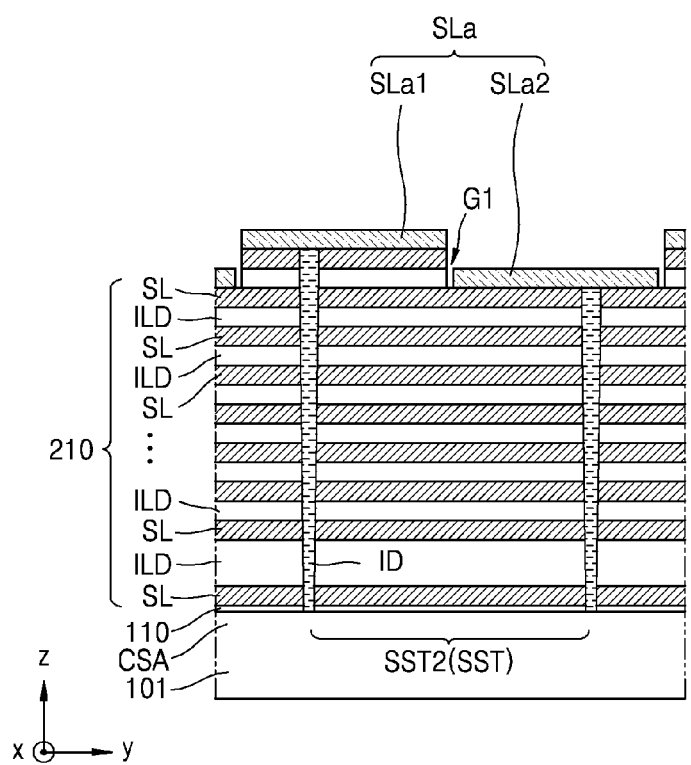

Referring to FIGS. 12A and 12B, an additional sacrificial layer SLa may be formed on the exposed sacrificial layer SL and the insulating layer dam ID in the stepped structure in the extension area EA. The additional sacrificial layer SLa may include the same material as the sacrificial layer SL. For example, the additional sacrificial layer SLa may include silicon nitride. The material of the additional sacrificial layer SLa is not limited thereto. Further, although the additional sacrificial layer SLa includes the same material as the sacrificial layer SL, by providing a slight difference, such as varying a component ratio, the additional sacrificial layer SLa may have a higher etch rate than the sacrificial layer SL for the same etching solution. For example, for a phosphoric acid solution (HP), the additional sacrificial layer SLa may be etched faster than the sacrificial layer SL. However, in some exemplary embodiments of the inventive concept, the additional sacrificial layer SLa and the sacrificial layer SL may include substantially the same material.

The process of forming the additional sacrificial layer SLa is briefly described as follows. First, a first material layer covering the mold structure 210 may be deposited relatively thick on the entire surface of the substrate 101. The first material layer may be a material layer for the additional sacrificial layer SLa. Next, the first material layer may be thinned by a wet etching. In this case, all of the first material layers on side portions of the stepped structure in the extension area EA may be removed. Subsequently, a photoresist (PR) pattern covering the extension area EA may be formed, and the first material layer on the cell array area CAA may be removed by using the PR pattern. Next, by removing the PR pattern, the additional sacrificial layer SLa may be formed on the sacrificial layer SL and the insulating layer dam ID that are exposed in the stepped structure of the extension area EA.

As illustrated in FIG. 12A, since the additional sacrificial layer SLa is not lowered at the side end ELe of the stepped structure of the extension area EA, a second gap G2 may be formed between the side end ELe and the additional sacrificial layer SLa of the stepped structure. The sacrificial layer SL under the additional sacrificial layer SLa may be exposed by the second gap G2. For example, more than one sacrificial layer SL under the additional sacrificial layer SLa may be exposed by the second gap G2.

As described above, the first stepped structure STS1 and the second stepped structure STS2 may have a difference of one layer at the same position in the first direction (x direction). For example, in FIG. 11B, in the case of the left side corresponding to the first stepped structure STS1, the sacrificial layer SL on the ninth layer may be exposed, and in the case of the right side corresponding, to the second stepped structure STS2, the sacrificial layer SL on the eighth layer may be exposed. As described above, as the first stepped structure STS1 and the second stepped structure STS2 form different layers at the same position in the first direction (x direction), a first gap G1 may be formed between the side surface of the first stepped structure STS1 and the additional sacrificial layer SLa. The sacrificial layer SL under the additional sacrificial layer SLa may be exposed through the first gap G1.

The first gap G1 may extend in the first direction (x direction) on each layer of the stepped structure. The first gap G1 may be substantially the same as the aforementioned first pad gap (PG1 in FIG. 2). The additional sacrificial layer SLa may be divided into a first additional sacrificial layer SLa1 and a second additional sacrificial layer SLa2 by the first gap G1, and thereafter, the first additional sacrificial layer SLa1 and the second additional sacrificial layer SLa2 may be replaced by portions of the first electrode pad ELp1 and the second electrode pad ELp2, respectively.

Figure 13A:
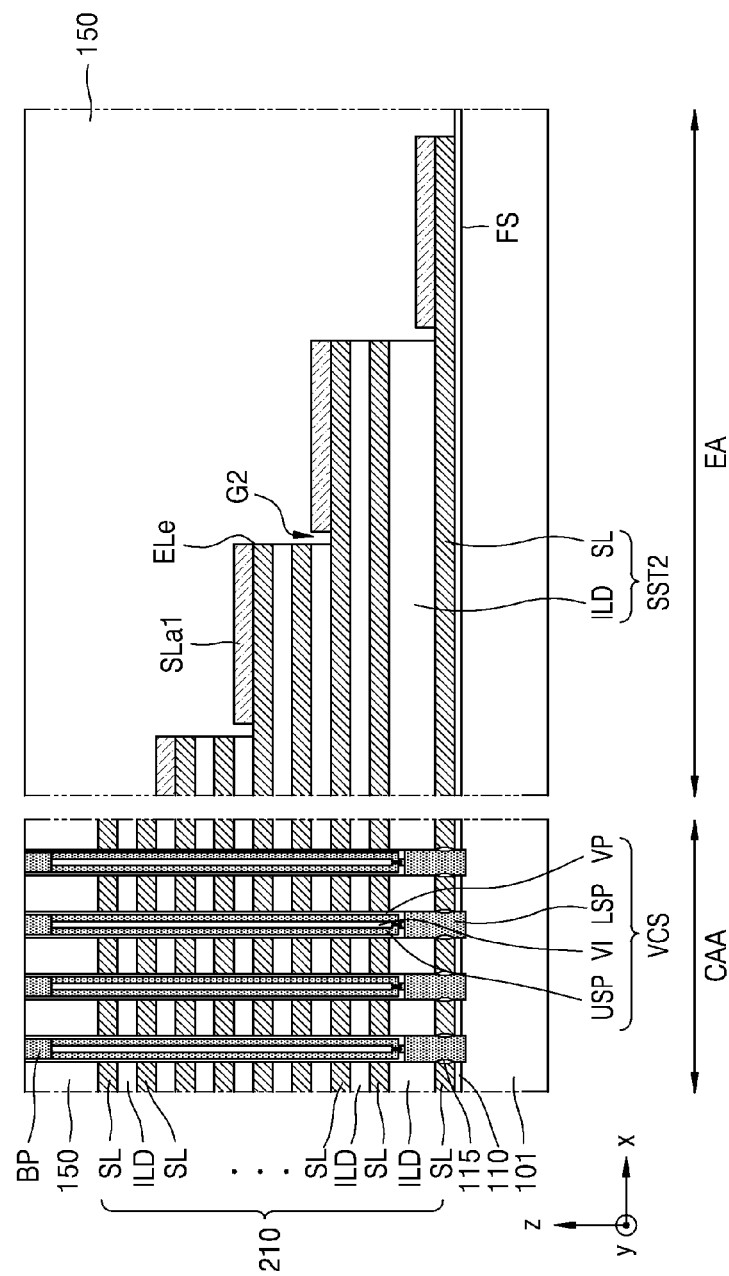
Figure 13B:
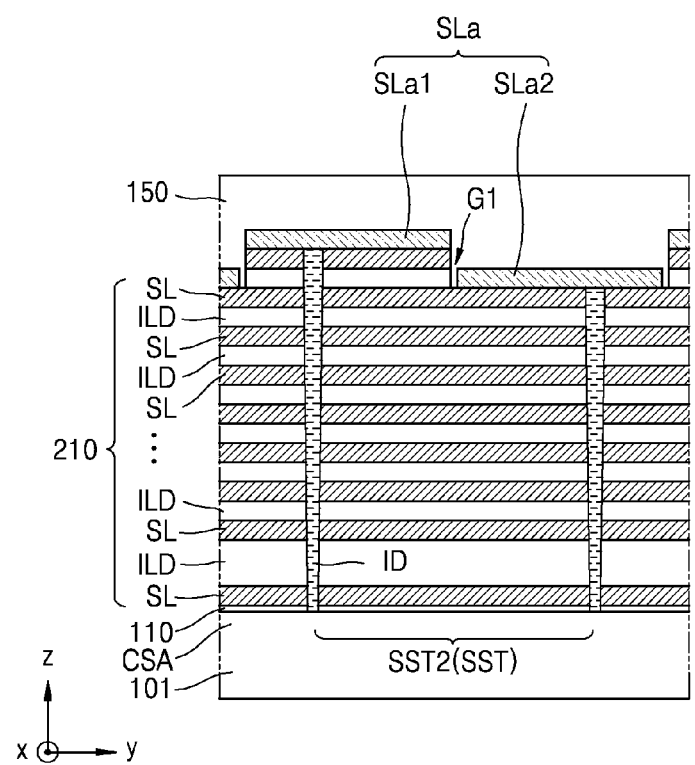

Referring to FIGS. 13A and 13B, a second material layer covering the mold structure 210 may be deposited on the entire surface of the substrate 101, and the planarized insulating layer 150 may be formed by planarizing the second material layer. The second material layer may cover the mold structure 210 in the cell array area CAA, and the mold structure 210 of the stepped structure and the additional sacrificial layer SLa in the extension area EA. The second material layer may include an insulating material, for example, an oxide. The material of the second material layer is not limited thereto.

Next, vertical holes penetrating the mold structure 210 may be formed in the cell array area CAA. Next, the lower semiconductor pattern LSP filling lower portions of the vertical holes are formed. The lower semiconductor pattern LSP may be formed by using a selective epitaxial growth (SEG) using the substrate 101 exposed by the vertical hole as a seed layer. Subsequently, in the cell array area CAA, the vertical channel structure VCS may be formed by forming the data storage pattern VP, the upper semiconductor pattern USP, and the buried insulating pattern VI in the vertical hole. Thereafter, the bit line pads BP may be formed on the upper semiconductor patterns USP of the vertical channel structure VCS.

In the case of the vertical-type nonvolatile memory device 100a of FIG. 4 including the dummy channel structure DCS in the extension area EA, the dummy channel structure DCS in the extension area EA may be formed in the process of forming the vertical channel structure VCS. For example, a vertical hole penetrating the planarized insulating layer 150 and the mold structure 210 may be formed in the extension area EA. As the vertical hole becomes farther away from the cell array area CAA, the number of sacrificial layers SL penetrated by the vertical holes may decrease. Next, by forming the lower semiconductor pattern LSP, the data storage pattern VP, the upper semiconductor pattern USP, and the buried insulating pattern VI in the vertical hole, the dummy channel structure DCS may be formed. In some exemplary, embodiments of the inventive concept, in the dummy channel structure DCS, the upper semiconductor pattern USP may be removed, and the buried insulation pattern VI may be formed directly on the data storage pattern VP.

Figure 14:
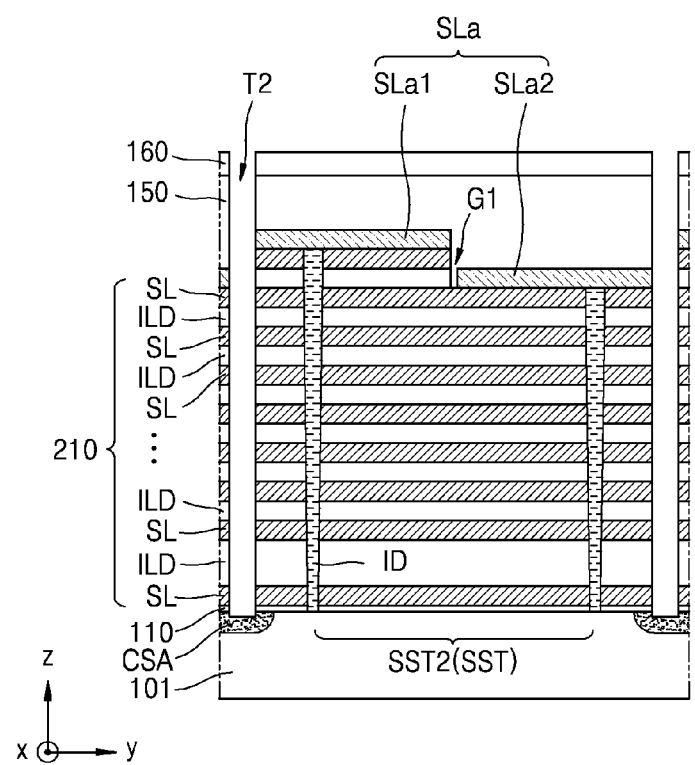

Referring to FIG. 14, the first upper interlayer insulating layer 160 covering the top surface of the vertical channel structure VCS and the planarized insulating layer 150 may be formed on the entire surface of the substrate 101. Next, by etching the first upper interlayer insulating layer 160, the planarized insulating layer 150, and the mold structure 210, the second trench T2 exposing the substrate 201 may be formed. A plurality of second trenches T2 may have a line shape extending in the first direction (x direction), and may be apart from each other in the second direction (y direction). The second trench T2 may be apart from the vertical channel structure VCS, and expose sidewalls of the sacrificial layer SL and the interlayer insulating layer ILD of the mold structure 210. In addition, the second trench T2 may expose sidewalls of the additional sacrificial layer SLa arranged on the top portion of the stepped structure in the extension area EA. The cell array area CAA and the expansion area EA may be separated into block units via the second trench T2. However, when the second trench T2 is formed, at least one additional second trench T2 extending in the first direction (x direction) may be formed in the cell array area CAA. In the additional second trench T2, an additional division area (refer to DAa in FIG. 2) may later be formed.

After the second trench T2 is formed, the common source area CSA may be formed by doping impurities on the upper area of the exposed substrate 101.

Figure 15A:
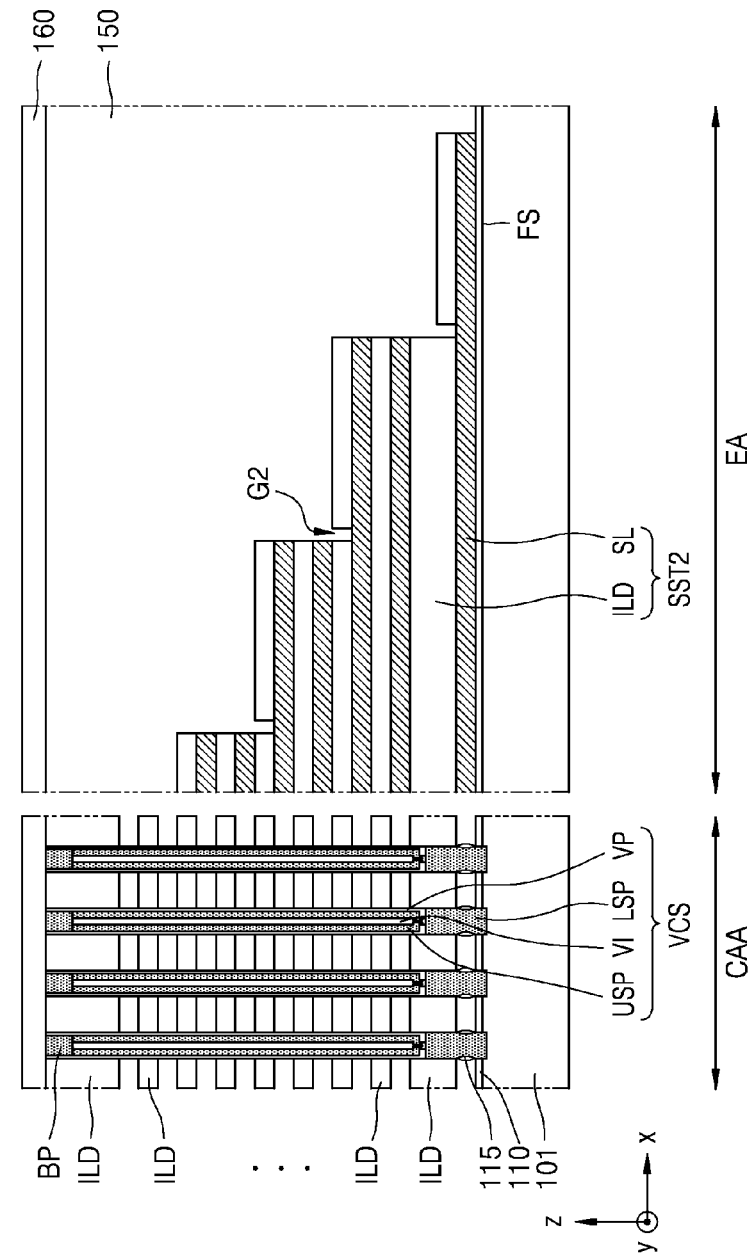
Figure 15B:
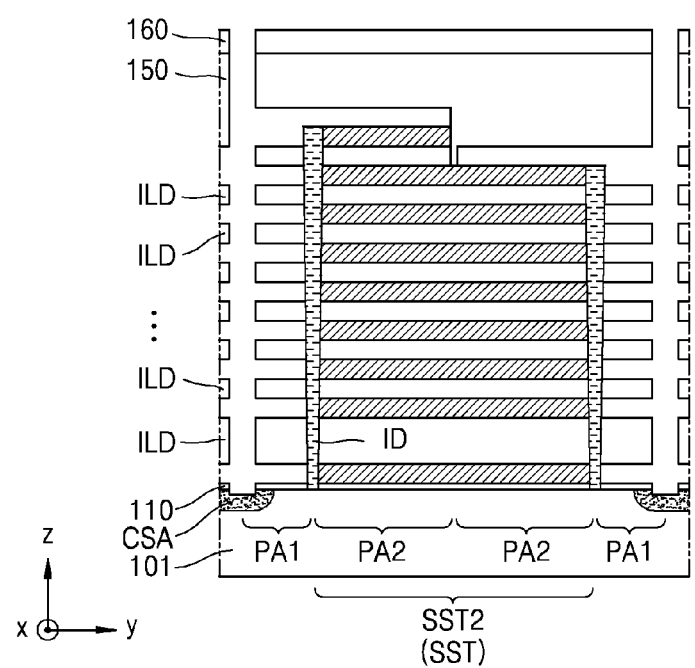

Referring to FIGS. 15A and 15B, the sacrificial layer SL and the additional sacrificial layer SLa that are exposed via the second trench T2 may be removed. The sacrificial layer SL and the additional sacrificial layer SLa may be removed by isotropically etching using an etching solution having etching selectivity with respect to the interlayer insulating layer ILD, the vertical channel structure VCS, and the substrate 101. For example, when the sacrificial layer SL and the additional sacrificial layer SLa are silicon nitride layers and the interlayer insulating layer ILD is a silicon oxide layer, the sacrificial layer SL and the additional sacrificial layer SLa may be removed by performing an isotropic etching process using an etching solution containing phosphoric acid.

By performing a removing process on the sacrificial layer SL and the additional sacrificial layer SLa, the sacrificial layer SL in the cell array area CAA, the sacrificial layer SL between the second trench T2 and the insulating layer dam ID in the extension area EA, and the additional layer SLa in the extension area EA may be removed. In addition, the sacrificial layer SL under the additional sacrificial layer SLa between the insulating layer dams ID adjacent to each other in the second direction (y direction) may be maintained without being etched. Accordingly, the second stack structure SST2 may be maintained between the insulating layer dams ID.

In addition, as described above, the additional sacrificial layer SLa may be etched faster than the sacrificial layer SL. Accordingly, in some exemplary embodiments of the inventive concept, the additional sacrificial layer SLa between the insulating layer dams ID and a portion of the sacrificial layer SL directly under the additional sacrificial layer SLa may be etched and removed.

Figure 16:
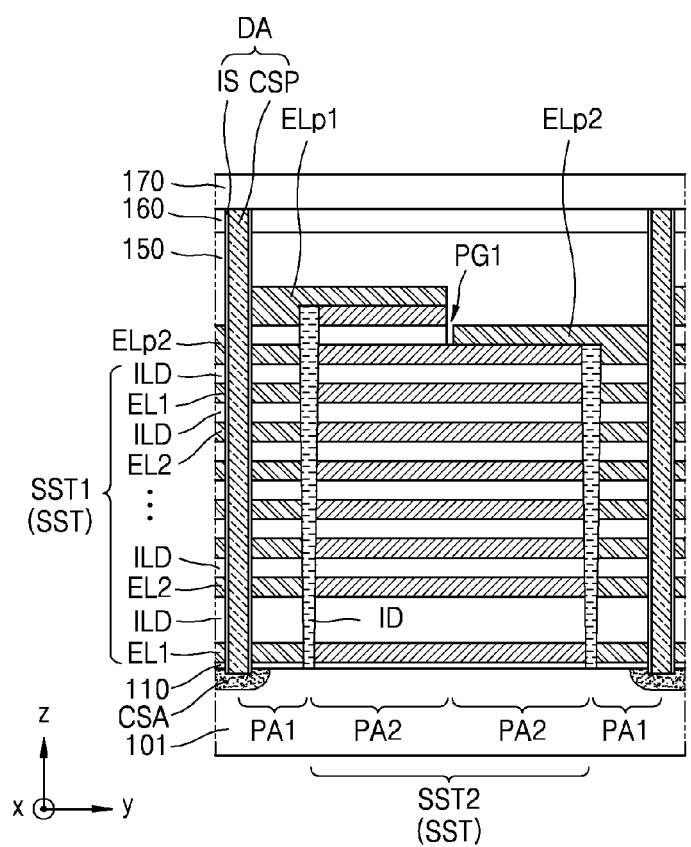

Referring to FIG. 16, after the sacrificial layer SL and the additional sacrificial layer SLa are removed, portions where the sacrificial layer SL and the additional sacrificial layer SLa have been removed may be filled with a first conductive layer. The first conductive layer may include a barrier layer and a metal layer. The barrier layer may include, for example, TiN, TaN, or WN, and the metal layer may include, for example, W. However, the materials of the barrier layer and the metal layer are not limited thereto.

Thereafter, the first conductive layer on the inner wall of the second trench T2 may be removed by an anisotropic etching. After the anisotropic etching, the first conductive layer remaining between the interlayer insulating layers ILD may constitute the first and second gate electrode layers EL1 and EL2. In addition, the first conductive layer remaining in the extension area EA may constitute the electrode pads (ELp1 and ELp2).

The entire process of removing the sacrificial layer SL and replacing the removed portions with the first and second gate electrode layers EL1 and EL2 may be called a gate electrode layer replacement process. In the method of fabricating the vertical-type nonvolatile memory device according to an exemplary embodiment of the inventive concept, by forming the first and second gate electrode layers EL1 and EL2 by using the gate electrode layer replacement process, the first stack structure SST1 may be formed in the cell array area CAA and portions of the extension area EA. In addition, when the first and second gate electrode layers EL1 and EL2 are formed, the electrode pads (ELp1 and ELp2) may be formed on the stepped structure in the extension area EA. The electrode pads (ELp1 and ELp2) may be formed by replacing portions of the sacrificial layer SL and the additional sacrificial layer SLa with the first conductive layer, and the first stack structure SST1 and the second stack structure SST2 may be arranged together under the electrode pads (ELp1 and ELp2). In other words, the electrode pads (ELP1 and ELp2) may include the first pad area PA1 on the first stack structure SST1 and the second pad area PA2 on the second stack structure SST2.

Next, the insulating spacer IS and the common source plug CSP may be formed in the second trench T2. The common source plug CSP may be connected to the common source area CSA. In some exemplary embodiments of the inventive concept, the common source are CSA may be formed after the replacement process of the first and second gate electrode layers EL1 and EL2.

Next, the second upper interlayer insulating layer 170 may be formed on the first upper interlayer insulating layer 160.

Figure 17A:
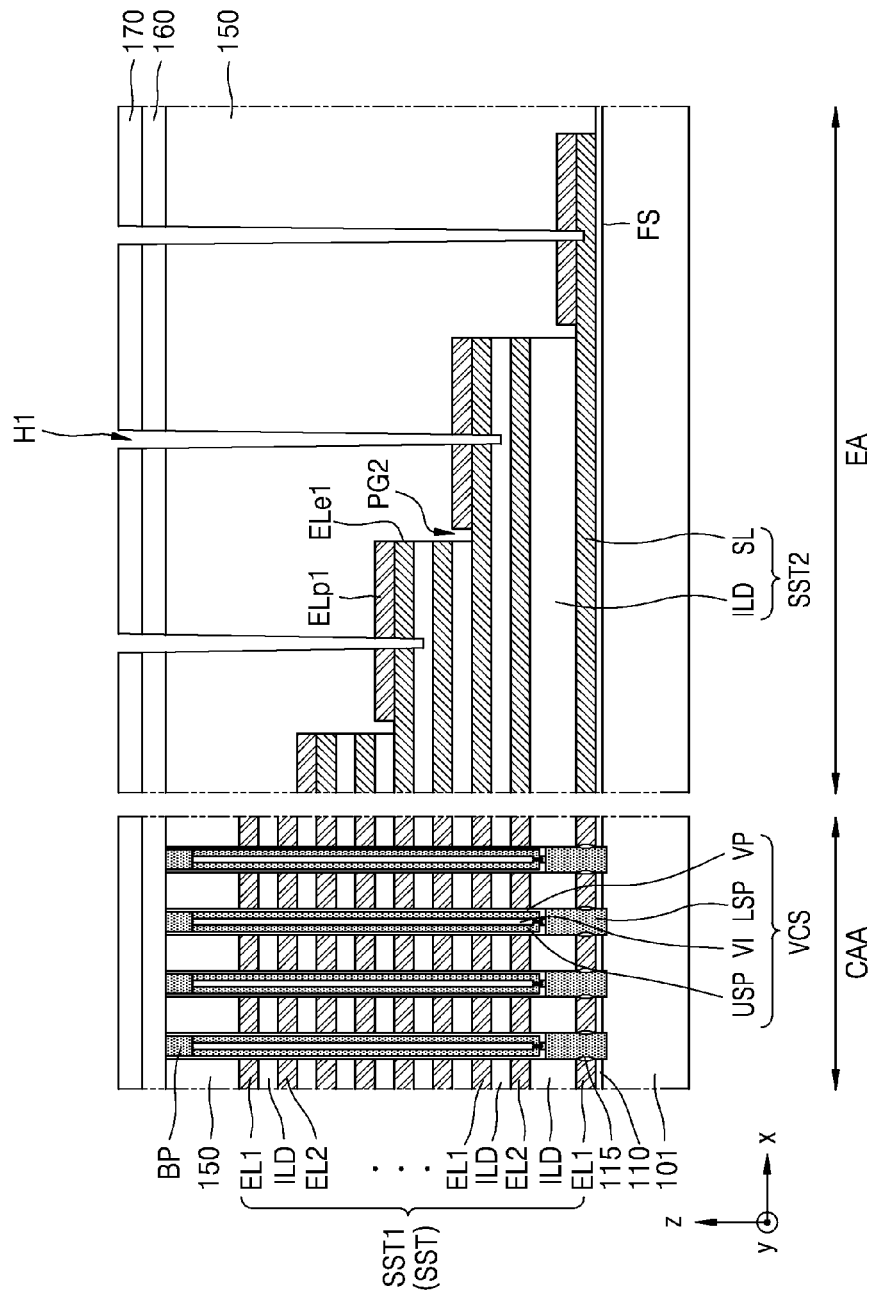
Figure 17B:
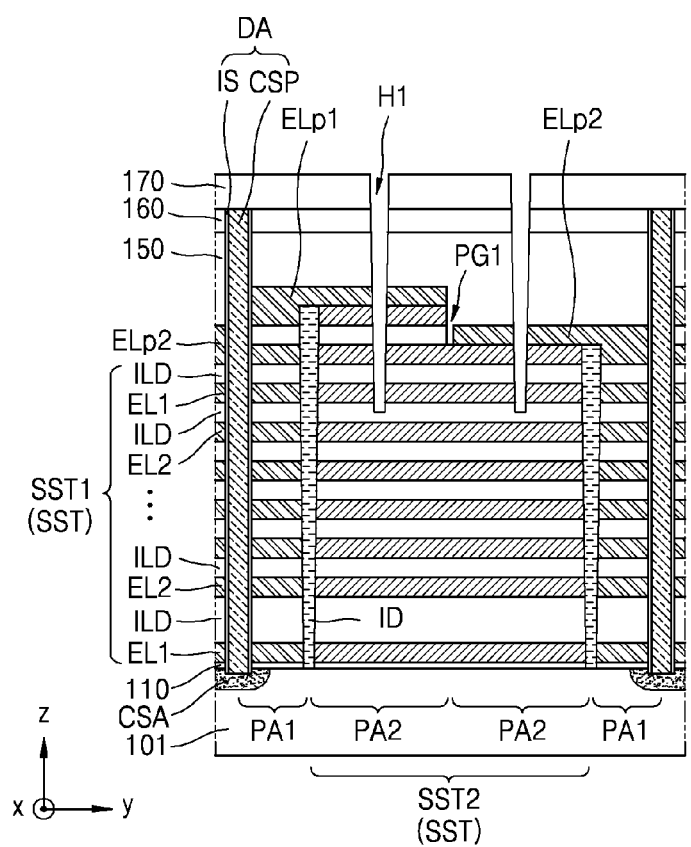

Referring to FIGS. 17A and 17B, a first hole H1 penetrating the first and second upper interlayer insulating layers 160 and 170 and the planarized insulating layer 150 may be formed in the extension area EA. After an etch mask pattern is formed on the second upper interlayer insulating layer 170, the first hole H1 may be formed by anisotropically forming the first and second upper interlayer insulating layers 160 and 170 and the planarized insulating layer 150.

Next, by burying the first hole H1 with the second conductive layer, the vertical contact VC, connected to each of the electrode pads (ELp1 and ELp2) may be formed. Subsequently, the bit line contact plugs BCP, the sub-bit lines SBL, the bit lines BL, and the connection lines CL described above may be formed.

While the inventive concept has been particularly shown and described with reference to exemplary embodiments thereof, it will be understood that various changes in form and details may be made thereto without departing from the spirit and scope of the inventive concept as set forth in the following claims.

What is claimed is:

1. A vertical-type nonvolatile memory device, the device comprising:
    a substrate including a cell array area and an extension area, the extension area extending in a first direction from the cell array area and comprising vertical contacts;
    a vertical channel structure extending in a vertical direction from a top surface of the substrate;
    a first stack structure comprising gate electrode layers and first interlayer insulating layers that are alternately stacked along sidewalls of the vertical channel structure;
    a plurality of division areas extending in the first direction and dividing the cell array area and the extension area into units in a second direction perpendicular to the first direction;
    in the extension area, two insulating layer dams are arranged between two of the division areas adjacent to each other in the second direction, wherein the two insulating layer dams extend in the first direction;
    a second stack structure comprising sacrificial layers and second interlayer insulating layers that are alternately stacked on the substrate between the two insulating layer dams; and
    an electrode pad connected to a first gate electrode layer of the gate electrode layers in the extension area,
    wherein the first stack structure extends from the cell array area to an area between one of the insulating layer dams and one of the division areas in the extension area,
    the electrode pad comprises a first pad area on the first stack structure and a second pad rea on the second stack structure, and
    a first vertical contact penetrates the electrode pad and is inserted into the second stack structure;
    wherein the first pad area and the second pad area are connected to each other on a top surface of one of the insulating layer dams, and
    the first pad area is connected to corresponding gate electrode layers.

2. The device of claim 1, wherein, in the vertical direction, the first pad area is thicker than the gate electrode layer in the cell array area.

3. The device of claim 1, wherein, in the vertical direction, the first pad area is thicker than the second pad area, and
    a lower portion of the first pad area is in contact with a sidewall of the one insulating layer dam and is connected to at least one of the gate electrode layers.

4. The device of claim 1, wherein the electrode pad is divided into a first electrode pad and a second electrode pad by a pad gap extending in the first direction between the two insulating layer dams, and
    the first vertical contact is connected to the first electrode pad and a second vertical contact is connected to the second electrode pad.

5. The device of claim 4, wherein an end portion of each the first electrode pad and the second electrode pad in the first direction have different heights from each other in the vertical direction.

6. The device of claim 4, wherein the gate electrode layers have a stepped structure in the first direction in the extension area,
    the gate electrode layers corresponding to the first electrode pad have a stepped structure each two layers, while a single odd-numbered gate electrode layer constitutes an upper layer,
    the gate electrode layers corresponding to the second electrode pad have a stepped structure each two layers, while a single even-numbered gate electrode layer constitutes an upper layer,
    the first electrode pad is connected to the odd-numbered gate electrode layer, and
    the second electrode pad is connected to the even-numbered gate electrode layer.

7. The device of claim 1, wherein, in the cell array area, another division area extending in the first direction is arranged between the two division areas adjacent to each other in the second direction.

8. The device of claim 1, wherein a peripheral circuit area is arranged on a lower portion of the substrate.

9. The device of claim 1, wherein the vertical channel structure has a first vertical channel structure in the cell array area and a second vertical channel structure in the extension area, and
    the second vertical channel structure is arranged in a portion where the first stack structure is formed in the extension area.

10. A vertical-type nonvolatile memory device, the device comprising:
    a substrate including a cell array area and an extension area extending in a first direction from the cell array area;
    a vertical channel structure extending in a vertical direction from a top surface of the substrate;
    a first stack structure comprising gate electrode layers and first interlayer insulating layers that are alternately stacked along sidewalk of the vertical channel structure;
    a division area extending in the first direction and dividing the cell array area and the extension area into units in a second direction perpendicular to the first direction;
    in the extension area, two insulating layer dams are arranged between two division areas adjacent to each other in the second direction, wherein the two insulating layer dams extend in the first direction;
    a second stack structure comprising sacrificial layers and second interlayer insulating layers that are alternately stacked on the substrate between the two insulating layer dams;
    an electrode pad connected to a first gate electrode layer of the gate electrode layers and arranged in the extension area, the electrode pad comprising a first pad area on the first stack structure and a second pad area on the second stack structure, wherein the electrode pad overlaps at least one of the insulating dams in the vertical direction; and
a first vertical contact arranged in the extension area and inserted into the second stack structure via the second pad area of the electrode pad.

11. The device of claim 10, wherein the electrode pad has a raised pad structure thicker than each of the gate electrode layers of the cell array area in the vertical direction,
a lower portion of the first pad area is in contact with a side surface of one of the insulating layer dams, and
the first pad area is connected to the second pad area on a top surface of the one insulating layer dam.

12. The device of claim 10, wherein the first stack structure under the first pad area is between one of the division areas and one of the insulating layer dams in the extension area, and
at least one of the gate electrode layers is connected to the first pad area.

13. The device of claim 10, wherein the electrode pad is divided into a first electrode pad and a second electrode pad by a pad gap extending in the first direction between the two insulating layer dams,
the first electrode pad and the second electrode pad have side end portions at substantially identical positions in the first direction and have different heights from each other in the vertical direction, and
the first vertical contact is connected to the first electrode pad and a second vertical contact is connected to the second electrode pad.

14. The device of claim 13, wherein the gate electrode layers have a stepped structure in the first direction in the extension area,
the gate electrode layers corresponding to the first electrode pad have a stepped structure each two layers, while a single odd-numbered gate electrode layer constitutes an upper layer,
the gate electrode layers corresponding to the second electrode pad have a stepped structure each two layers, while an even-numbered gate electrode layer constitutes an upper layer,
the first electrode pad is connected to the odd-numbered gate electrode layer, and
the second electrode pad is connected to the even-numbered gate electrode layer.

15. The device of claim 10, wherein, in the cell array area, another division area extending in the first direction is arranged between the two division areas adjacent to each other in the second direction,
the vertical channel structure comprises a first vertical channel structure in the cell array area and a second vertical channel structure in the extension area, and
the second vertical channel structure is arranged in a portion where the first stack structure is formed in the extension area.

16. A vertical-type nonvolatile memory device, the device comprising:
a substrate including a cell array area and an extension area, the extension area extending in a first direction from the cell array area and comprising vertical contacts;
a vertical channel structure extending in a vertical direction from a top surface of the substrate;
a first stack structure comprising gate electrode layers and first interlayer insulating layers that are alternately stacked along sidewalls of the vertical channel structure;
a plurality of division areas extending in the first direction and dividing the cell array area and the extension area into units in a second direction perpendicular to the first direction;
in the extension area, two insulating layer dams are arranged between two of the division areas adjacent to each other in the second direction, wherein the two insulating layer dams extend in the first direction;
a second stack structure comprising sacrificial layers and second interlayer insulating layers that are alternately stacked on the substrate between the two insulating layer dams;
a first electrode pad connected to a first gate electrode layer of the gate electrode layers in the extension area; and
a second electrode pad connected to a first sacrificial layer of the sacrificial layers in the extension area,
wherein one of the two insulating layer dams is disposed under the first electrode pad and the other insulating layer dam is disposed under the second electrode pad.

17. The vertical-type nonvolatile memory device of claim 16, wherein the first electrode pad is higher than the second electrode pad in the vertical direction.

* * * * *